(12) United States Patent
Miller

(10) Patent No.: US 6,791,162 B2
(45) Date of Patent: Sep. 14, 2004

(54) UNIT CELL ARCHITECTURE FOR ELECTRICAL INTERCONNECTS

(75) Inventor: Samuel Lee Miller, Albuquerque, NM (US)

(73) Assignee: MEMX, Inc., Albuquerque, NM (US)

( * ) Notice: Subject to any disclaimer, the term of this patent is extended or adjusted under 35 U.S.C. 154(b) by 0 days.

(21) Appl. No.: 10/099,594

(22) Filed: Mar. 16, 2002

(65) Prior Publication Data

US 2003/0173649 A1 Sep. 18, 2003

(51) Int. Cl.[7] .............................................. H01L 23/544
(52) U.S. Cl. ...................... 257/620; 257/680; 257/729; 257/730; 257/678; 257/909; 359/626; 372/92; 372/97; 372/98; 310/309; 385/16; 385/8; 385/33
(58) Field of Search ................................ 257/620, 680, 257/729, 730, 678, 909; 359/626; 372/92, 97, 98; 320/309; 365/16, 8, 33

(56) References Cited

U.S. PATENT DOCUMENTS

| | | | |
|---|---|---|---|
| 4,866,508 A | 9/1989 | Eichelberger et al. ......... 357/74 |
| 4,904,073 A | 2/1990 | Lawton et al. ............... 350/613 |
| 4,907,062 A | 3/1990 | Fukushima .................... 375/75 |
| 5,519,629 A | 5/1996 | Snider ......................... 364/490 |
| 5,587,923 A | 12/1996 | Wang ........................... 364/490 |
| 5,702,963 A | 12/1997 | Vu et al. ................. 437/41 GS |
| 5,835,378 A | 11/1998 | Scepanovic et al. ... 364/468.28 |
| 5,856,101 A | 1/1999 | Hubbell et al. ................. 435/6 |
| 6,005,649 A | 12/1999 | Krusius et al. ................ 349/73 |
| 6,091,620 A | 7/2000 | Kablanian ...................... 365/63 |
| 6,253,001 B1 | 6/2001 | Hoen ............................ 385/17 |
| 6,396,975 B1 * | 5/2002 | Wood et al. ................... 385/18 |
| 6,428,173 B1 * | 8/2002 | Dhuler et al. ............... 359/872 |
| 6,445,841 B1 * | 9/2002 | Gloeckner et al. ............ 385/17 |
| 6,449,406 B1 * | 9/2002 | Fan et al. ...................... 385/17 |
| 6,453,083 B1 * | 9/2002 | Husain et al. ................. 385/17 |
| 2002/0050744 A1 * | 5/2002 | Bernstein et al. ............. 310/12 |
| 2002/0071627 A1 * | 6/2002 | Smith et al. ................... 385/15 |
| 2002/0085594 A1 * | 7/2002 | Pezeshki et al. .............. 372/20 |
| 2002/0093720 A1 * | 7/2002 | Hichwa et al. .............. 359/920 |
| 2002/0101769 A1 * | 8/2002 | Garverick et al. .......... 365/200 |
| 2002/0154422 A1 * | 10/2002 | Sniegowski et al. ........ 359/849 |

OTHER PUBLICATIONS

U.S. patent application Ser. No. 10/099,140, Miller et al., filed Mar. 16, 2002.
U.S. patent application Ser. No. 10/100,173, Miller, filed Mar. 16, 2002

\* cited by examiner

Primary Examiner—Nathan J. Flynn
Assistant Examiner—Fazli Erdem
(74) Attorney, Agent, or Firm—Marsh Fischmann & Breyfogle LLP

(57) ABSTRACT

A unit cell is disclosed that facilitates the creation of a layout of at least a portion of a microelectromechanical system. The unit cell includes a plurality of electrical traces. Some of these electrical traces pass through the unit cell. Other electrical traces extend only part way through the unit cell. At least certain boundary conditions exist for the unit cell that allow the same to be tiled in a row and in a manner that results in adjacently disposed unit cells in the row being electrically interconnected in the desired manner.

30 Claims, 13 Drawing Sheets

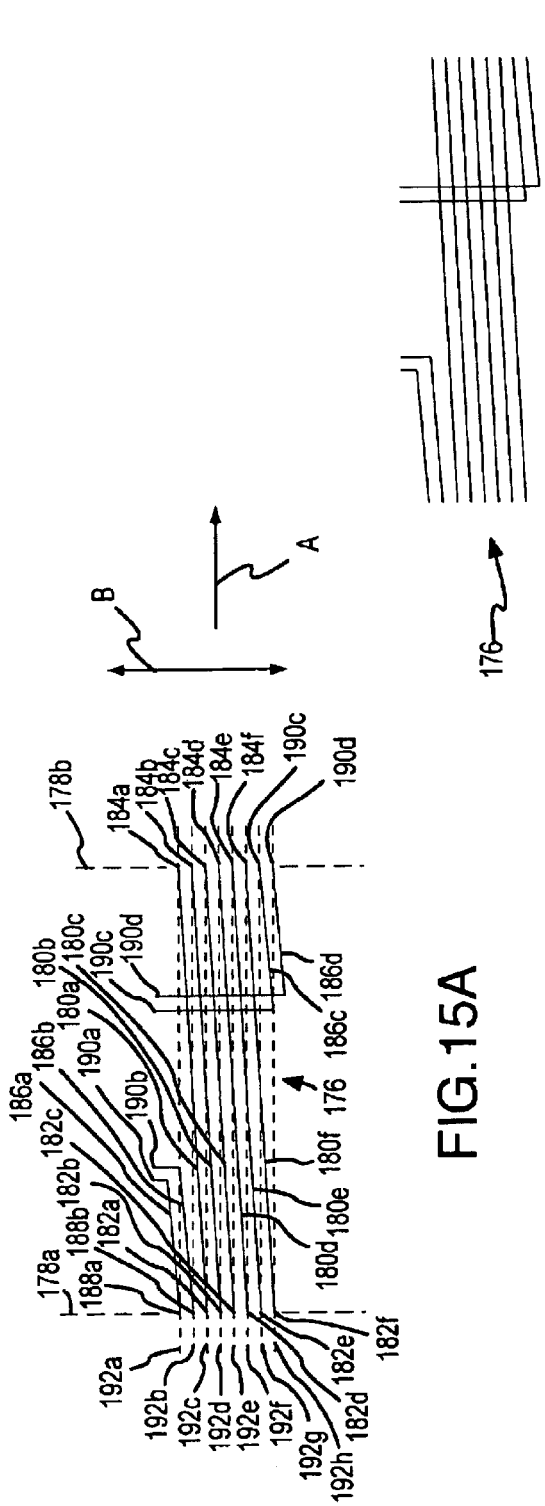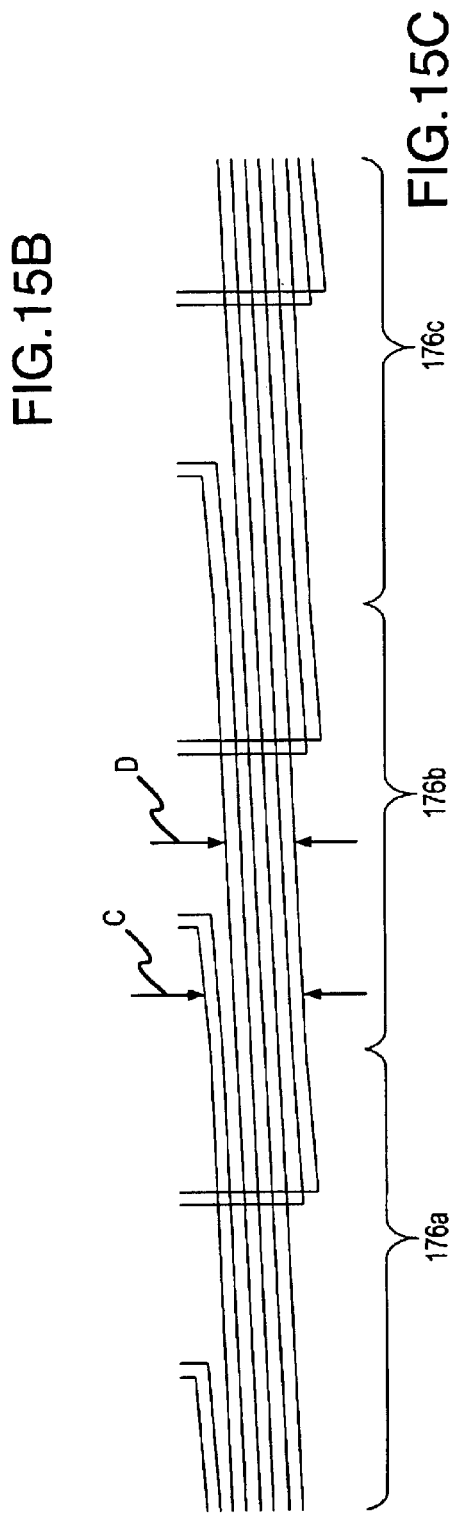

UNIT CELL ARCHITECTURE FOR ELECTRICAL INTERCONNECTS

FIELD OF THE INVENTION

The present invention generally relates to the field of microelectromechanical systems and, more particularly, to a unit cell that facilitates the layout of at least a portion of such a system.

BACKGROUND OF THE INVENTION

There are a number of microfabrication technologies that have been utilized for making microstructures (e.g., micromechanical devices, microelectromechanical devices) by what may be characterized as micromachining, including LIGA (Lithography, Galvonoforming, Abforming), SLIGA (sacrificial LIGA), bulk micromachining, surface micromachining, micro electrodischarge machining (EDM), laser micromachining, 3-D stereolithography, and other techniques. Bulk micromachining has been utilized for making relatively simple micromechanical structures. Bulk micromachining generally entails cutting or machining a bulk substrate using an appropriate etchant (e.g., using liquid crystal-plane selective etchants; using deep reactive ion etching techniques). Another micromachining technique that allows for the formation of significantly more complex microstructures is surface micromachining. Surface micromachining generally entails depositing alternate layers of structural material and sacrificial material using an appropriate substrate (e.g., a silicon wafer) which functions as the foundation for the resulting microstructure. Various patterning operations (collectively including masking, etching, and mask removal operations) may be executed on one or more of these layers before the next layer is deposited so as to define the desired microstructure. After the microstructure has been defined in this general manner, the various sacrificial layers are removed by exposing the microstructure and the various sacrificial layers to one or more etchants. This is commonly called "releasing" the microstructure from the substrate, typically to allow at least some degree of relative movement between the microstructure and the substrate.

It has been proposed to fabricate various types of optical switch configurations using various micromachining fabrication techniques. One of the issues regarding these types of optical switches is the number of mirrors that may be placed on a die. A die is commonly referred to as that area defined by one field of a stepper that is utilized to lay out the die. Reducing the size of the mirrors in order to realize the desired number of mirrors on a die may present various types of issues. For instance, there are of course practical limits as to how small the mirrors can be fabricated, which thereby limits the number of ports for the optical switch. Also, the optical requirements of the system using the mirrors may require mirrors larger than some minimum size. Therefore, it may not be possible to fabricate the optical switch with a certain number of ports using a single die. This presents a challenge regarding how to route electrical signals.

BRIEF SUMMARY OF THE INVENTION

The present invention generally relates to a unit cell. This unit cell may be used to create a layout for at least part of a microelectromechanical system. Although this unit cell will contain at least a plurality of electrical lines, conductors, traces, or the like (hereafter "traces"), various microstructure assemblies (e.g., one or more electrical load-based microstructures) may be included as part of the unit cell as well. Generally, the unit cell meets a number of predetermined boundary conditions such that once this unit cell is drawn or otherwise created, it may be simply copied, translated, and pasted an appropriate number of times to define at least part of a microelectromechanical system. This process may be collectively characterized as tiling the unit cell. In any case, a plurality of structurally identical unit cells will be placed in end-to-end relation in one or more rows as desired/required. Adjacent unit cells in each row will be electrically interconnected based upon the unit cell satisfying the predetermined boundary conditions.

A first aspect of the present invention is embodied by a chip that is formed using a plurality of unit cells. Each unit cell is structurally identical, and therefore only one unit cell need be described. The unit cell includes first and second sides. A plurality of these unit cells may be disposed in end-to-end relation to define a row that at least generally extends in a first direction. More specifically, the first side and second side of each adjacent pair of unit cells in a given row will be disposed up against each other such that the first and second sides of the unit cell will be spaced from each other in the first direction. In the event that a row of unit cells is characterized as being laterally extending (e.g., extending along/defining a width dimension for the chip), the first and second sides of the unit cell could then be characterized as being laterally spaced. The unit cell includes a plurality of first electrical traces that extend between its first and second sides. The unit cell also includes a plurality of second electrical traces. These second electrical traces extend from any of the first and second sides and terminate within the unit cell (i.e., at an interior location). Therefore, both ends of each first electrical trace are disposed on a perimeter of the unit cell. However, only one end of each second electrical trace is disposed on a perimeter of the unit cell.

There are a number of boundary conditions associated with the unit cell of the first aspect. For ease of description of these boundary conditions, a row of unit cells on the chip will be characterized as at least generally extending in a first dimension (e.g., a width dimension for the chip). A second dimension is perpendicular to this first dimension (e.g., a height dimension for the chip). The first and second dimensions may be such that they collectively define a plan view of the chip formed from the unit cells. The required boundary conditions for the unit cell are as follows: 1) each first electrical trace at the first side of the unit cell, and either a different first electrical trace at the second side of the unit cell or a second electrical trace at the second side of the unit cell, are disposed along a common reference line that is parallel with the first dimension; 2) each first electrical trace at the second side of the unit cell, and either a different first electrical trace at the first side of the unit cell or a second electrical trace at the first side of the unit cell, are disposed along a common reference line that is parallel with the first dimension; 3) each second electrical trace that is disposed on the first side of the unit cell and one first electrical trace on the second side of the unit cell are disposed along a common reference line that is parallel with the first dimension; and 4) each second electrical trace that is disposed on the second side of the unit cell and one first electrical trace on the first side of the unit cell are disposed along a common reference line is parallel with the first dimension.

Various refinements exist of the features noted in relation to the first aspect of the present invention. Further features may also be incorporated in the present invention as well. These refinements and additional features may exist individually or in any combination. The noted boundary conditions facilitate the electrical interconnection of adjacent unit cells in a row from which a chip may be formed. Any number of first and/or second electrical traces may exist within the unit cell and still satisfy the noted boundary conditions. However, in one embodiment, there is an even number of first electrical traces, an even number of second electrical traces, or both. One or more second electrical traces may extend from the first side of the unit cell, one or more second electrical traces may extend from the second side of the unit cell, or both and still satisfy the above-noted boundary conditions as well. In one embodiment, none of the traces in the unit cell cross over each other.

Additional boundary conditions may exist for the unit cell in relation to the first and second electrical traces. For instance, each of the first electrical traces at the first and second sides of the unit cell may be offset in a direction that is perpendicular or orthogonal to the first direction in which the noted row of unit cells at least generally extends. Each second electrical trace at its corresponding first or second side of the unit cell and where the particular second electrical trace terminates at its corresponding interior location within the unit cell may be offset in a direction that is perpendicular or orthogonal to the first direction in which the noted row of unit cells at least generally extends as well.

A spacing between the first and second sides of each unit cell associated with the first aspect may correspond with a single exposure field of photolithographic stepper. Stated another way, the spacing between the first and second sides of each unit cell may correspond with one dimension of a die (e.g., a die width). As used herein, a "die" means an area encompassed by a single exposure field of a photolithographic stepper. Each unit cell may define at least a portion of a die. Another option is for each unit cell to define an entire die. In this case where the chip includes multiple unit cells/die in the noted row, the chip may further include a second row of a plurality of partial unit cells or partial die. Yet another option is for the chip to include multiple rows, each having a plurality of the noted unit cells disposed in end-to-end relation. A first group of rows may encompass at least part of a first die, and a second group of rows may encompass at least part of a second die. No single row of unit cells is in both the first and second group in this instance. In one embodiment, the first group of rows encompasses the entire first die, while the second group of rows encompasses only part of the second die.

The unit cell associated with the first aspect many include one or more electrical load-based microstructures disposed within the interior of the unit cell. Each electrical load-based microstructure could then be interconnected with a different, single second electrical trace. In the case where there are a plurality of electrical load-based microstructures in the unit cell, each of these microstructures may be of the same type or there may be at least two different types of such microstructures. In one embodiment, the noted electrical load-based microstructures are actuators of a mirror assembly that includes a mirror and an elevation structure interconnected with the mirror, such that at least one actuator may be interconnected with the elevation structure to move the corresponding mirror in a desired manner. The plurality of unit cells utilized by the chip may then define or be characterized as a mirror array.

In what may be characterized as a first embodiment, the first side of a first unit cell of the chip of the first aspect may define a first chip side, while the second side of a second unit cell of the chip may define a second chip side. The chip in this first embodiment may include at least one device region that is disposed between the first and second chip sides, a first off-chip contact region that is located between the first chip side and the device region that is closest to first chip side, and a second off-chip contact region that is located between the second chip side and the device region that is closest to the second chip side. At least one electrical load-based microstructure may be disposed in at least one of the device regions in the case of the first embodiment, and more typically at least one electrical load-based microstructure will be disposed in each device region in the case of the first embodiment. Each electrical load-based microstructure may be separately and independently addressed from at least one of the first and second off-chip contact regions in the first embodiment. The first and second off-chip contact regions in this first embodiment each may include a plurality of off-chip electrical contacts. Each off-chip electrical contact may be in the form of a pad for wire bonding, solder bump bonding, or the like. Each off-chip electrical contact may be associated with a different electrical path. This electrical path may be defined by only one second electrical trace, one second electrical trace and one or more first electrical traces, or a plurality of first electrical traces.

The chip of the first aspect may include first and second rows, each having a plurality of microstructure assemblies. An electrical trace bus may be located between these first and second rows of microstructure assemblies and at least the bus may be defined by the unit cells of the first aspect. That is, the noted plurality of first and second electrical traces collectively define the electrical trace bus. In one embodiment, the electrical trace bus is interconnected with at least some of the microstructure assemblies in one of the first and second rows, and none of the microstructure assemblies in the other of the first and second rows (e.g., the electrical trace bus services only one of the first and second rows, and not the other of the first and second rows). In another embodiment, the electrical trace bus is interconnected with at least some of the microstructure assemblies in both of the first and second rows (e.g., the electrical trace bus services both of the first and second rows). Each microstructure assembly may be a mirror assembly that includes a mirror, an elevation structure interconnected with the mirror, and at least one actuator interconnected with the elevation structure. A different second electrical trace would thereby "peel off" from the noted electrical trace bus and progress to each of these actuators.

A plurality of rows of mirror assemblies of the above-noted type may be disposed on the chip. At least one second electrical trace may be interconnected with each actuator of each mirror assembly. These mirror assemblies may be disposed on the chip in a variety of arrangements. In one embodiment, a center of each mirror in a given row is disposed along a common reference line. In another embodiment, a center of each mirror in a given row may be alternately disposed on opposite sides of a central reference line. In either case, the mirrors in a given row may be equally spaced in relation to a direction in which the row at least generally extends. Preferably, the width of the chip is an integer multiple of the noted mirror spacing.

Each unit cell of the first aspect may include what may be characterized as a device region that is disposed inwardly of the first and second sides of the unit cell. A plurality of off-chip electrical contacts may be disposed between the device region and the first side of the unit cell, and a plurality of off-chip electrical contacts may be disposed between the device region and the second side of the unit cell. As such, when a plurality of unit cells are disposed in end-to-end relation, the chip will include at least one pair of interior regions that each have a plurality of off-chip electrical contacts. These particular "interior" off-chip electrical contacts will typically not used be used for providing a signal to or reading a signal from the chip. Instead, these "interior" off-chip electrical contacts may simply function as a passive electrode.

The plurality of first and second electrical traces associated with each unit cell may collectively define an electrical trace bus. At least some of the second electrical traces may be interconnected with an electrical load-based microstructure (e.g., an actuator of a mirror assembly of the above-noted type). In one embodiment a maximum number of electrical traces along any portion of the electrical trace bus is one-half of the number of electrical load-based microstructures that are interconnected with any second electrical trace of the noted electrical trace bus. The layout of the plurality of first and second electrical traces in the unit cell may also be such that the number of electrical traces in the electrical trace bus varies along the length of the electrical trace bus. In this regard, the noted electrical trace bus may include a plurality of first and second electrical trace bus segments, with a second electrical trace bus segment being disposed between adjacent pairs of first electrical trace bus segments. In one embodiment, the same number of electrical traces are included in each first electrical trace bus segment, the same number of electrical traces are included in each second electrical trace bus segment, and the numbers of electrical traces in the first and second electrical trace bus segments are different.

BRIEF DESCRIPTION OF THE SEVERAL VIEWS OF THE DRAWINGS

FIG. 13 is a plan view of a plurality of tiled unit cells from FIG. 11.

FIG. 15A is one embodiment of a unit cell precursor that may be used to define at least the type of electrical trace bus utilized by the mirror array of FIG. 2.

FIG. 15B illustrates the unit cell precursor of FIG. 15A without the various reference lines.

FIG. 15C is a unit cell that is defined by a pair of the unit cell precursors of FIG. 15A.

DETAILED DESCRIPTION OF THE INVENTION

Figure 1A:
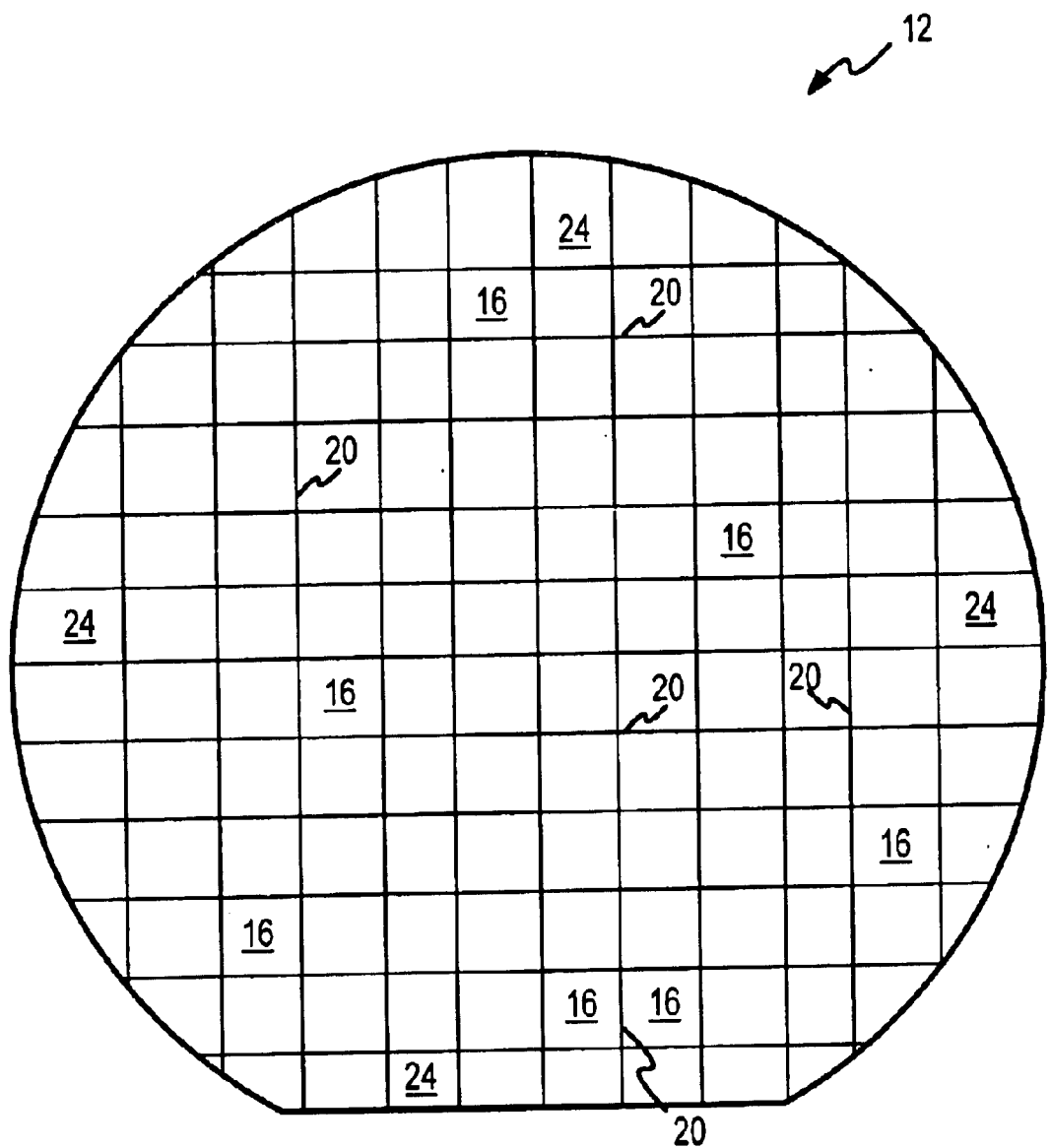
FIG. 1A is a plan view of one embodiment of a wafer having a plurality of die.

The present invention will now be described in relation to the accompanying drawings that at least assist in illustrating its various pertinent features. Surface micromachining may be utilized to fabricate the various microstructures to be described herein. Various surface micromachined microstructures and the basic principles of surface micromachining are disclosed in U.S. Pat. Nos. 5,867,302, issued Feb. 2, 1999, and entitled "BISTABLE MICROELECTROMECHANICAL ACTUATOR"; and 6,082,208, issued Jul. 4, 2000, and entitled "METHOD FOR FABRICATING FIVE-LEVEL MICROELECTROMECHANICAL STRUCTURES AND MICROELECTROMECHANICAL TRANSMISSION FORMED", the entire disclosures of which are incorporated by reference in their entirety herein.

Surface micromachining generally entails depositing alternate layers of structural material and sacrificial material using an appropriate substrate which functions as the foundation for the resulting microstructure, which may include one or more individual microstructures. The term "substrate" as used herein means those types of structures that can be handled by the types of equipment and processes that are used to fabricate micro-devices on, within, and/or from the substrate using one or more micro photolithographic patterns. An exemplary material for the substrate is silicon. Various patterning operations (collectively encompassing the steps of masking, etching, and mask removal operations) may be executed on one or more of these layers before the next layer is deposited so as to define the desired microstructure. After the microstructure has been defined in this general manner, at least some of the various sacrificial layers are removed by exposing the microstructure and the various sacrificial layers to one or more etchants. This is commonly called "releasing" the microstructure from the substrate, typically to allow at least some degree of relative movement between the microstructure and the substrate. The term "sacrificial layer", therefore, means any layer or portion thereof of any surface micromachined microstructure that is used to fabricate the microstructure, but which does not exist in the final configuration. Exemplary materials for the sacrificial layers described herein include undoped silicon dioxide or silicon oxide, and doped silicon dioxide or silicon oxide ("doped" indicating that additional elemental materials are added to the film during or after deposition). Exemplary materials for the structural layers of the microstructure include doped or undoped polysilicon and doped or undoped silicon. The various layers described herein may be formed/deposited by techniques such as chemical vapor deposition (CVD) and including low-pressure CVD (LPCVD), atmospheric-pressure CVD (APCVD), and plasma-enhanced CVD (PECVD), thermal oxidation processes, and physical vapor deposition (PVD) and including evaporative PVD and sputtering PVD, as examples.

Only those portions of a microelectromechanical system that are relevant to the present invention will be described in relation to the following embodiments. The entirety of these various embodiments of microelectromechanical systems are defined by a plurality of microstructures, including structures that span feature sizes of less than 1 micron to many hundreds of microns. For convenience, the word "microstructure" may not be repeated in each instance in relation to each of these components. However, each such component is in fact a microstructure and "microstructure" is a structural limitation in the accompanying claims. Since the same (structurally and/or functionally) microstructure may be used in a variety of these embodiments, a brief discussion of the least some of these microstructures will be provided in an attempt to minimize repetitious description.

One or more microstructures of one or more of the embodiments of microelectromechanical systems to be described herein move relative to other portions of the microelectromechanical system, and including a substrate that is used in the fabrication of the microelectromechanical system. Unless otherwise noted as being a key requirement for a particular embodiment, this relative movement may be achieved in any appropriate manner. Surface micromachining fabrication techniques allow for relative movement without having any rubbing or sliding contact between a movable microstructure and another microstructure or the substrate. Movement of a surface micromachined microstructure relative to the substrate may be provided by a flexing or elastic deformation of one or more microstructures of the microelectromechanical system. Another option that may be utilized to allow a given microstructure to move relative to the substrate is to interconnect two or more microstructures together in a manner such that there is relative movement between these microstructures while the microstructures are in interfacing relation at least at some point in time during the relative movement (e.g., a hinge connection).

At least one actuator may be utilized by one or more of the various embodiments of microelectromechanical systems to be described herein. Unless otherwise noted as being a key requirement for a particular embodiment, each of the following actuator characteristics or attributes will be applicable. Any appropriate type of actuator may be utilized. Appropriate types of actuators include without limitation electrostatic comb actuators, thermal actuators, piezoelectric actuators, magnetic actuators, and electromagnetic actuators. Moreover, any appropriate way of interconnecting an actuator with the substrate may be utilized. One actuator may be utilized to exert the desired force on a given microstructure, or multiple actuators may be interconnected in a manner to collectively exert the desired force on a given microstructure. The movement of an actuator may be active (via a control signal or a change in a control signal), passive (by a stored spring force or the like), or a combination thereof.

One or more of the various embodiments of microelectromechanical systems to be described herein utilize what may be characterized as an elongated coupling or tether to interconnect two or more microstructures. Unless otherwise noted as being a key requirement for a particular embodiment, any appropriate configuration may be used for any such tether. In at least certain applications, it may be desirable to have this tether be "stiff." Cases where a tether of this configuration is desired or preferred will be referred to as a "stiff tether." A "stiff tether" means that such a tether is sufficiently stiff so as to not buckle, flex, or bow to any significant degree when exposed to external forces typically encountered during normal operation of the microelectromechanical system. As such, no significant elastic energy is stored in the tether, the release of which could adversely affect one or more aspects of the operation of the microelectromechanical system.

One or more of the various embodiments of microelectromechanical systems to be described herein may use an elevator or the like. This elevator is interconnected with the substrate in a manner such that at least part of the elevator is able to move at least generally away from or toward the substrate. Whether at least part of the elevator moves at least generally away from or at least generally toward the substrate is dependent upon the direction of the resulting force that is acting on the elevator. Unless otherwise noted as being a key requirement for a particular embodiment, each of the following elevator characteristics will be applicable. Any way of interconnecting the elevator with the substrate that allows for the desired relative movement between the elevator and the substrate may be utilized. Any configuration may be used for the elevator that allows for the desired relative movement between the elevator and the substrate may be utilized (single or multiple beam structures of any appropriate configuration). The desired movement of the elevator relative to the substrate may be along any path (e.g., along an arcuate path) and in any orientation relative to the substrate (e.g., along a path that is normal to the substrate; along a path that is at an angle other than 90° relative to the substrate).

One or more of the various embodiments of microelectromechanical systems to be described herein may use what is characterized as a pivotless compliant microstructure. A pivotless compliant microstructure means a microstructure having: 1) a plurality of flexible beams that are each attached or anchored (directly or indirectly) to the substrate at a discrete location so as to be motionless relative to the substrate at the attachment or anchor location, and such that other portions of each such flexible beam are able to move relative to the substrate by a flexing or bending-like action; 2) a plurality of cross beams that are not attached to the substrate (other than through an interconnection with one or more flexible beams), and that either interconnect a pair of flexible beams at a location that is able to move relative to the substrate or that interconnect with one or more other cross beams; 3) an appropriate input structure (e.g., a single beam; a yoke) and an appropriate output structure (e.g., a single beam; a yoke); and 4) of a configuration that exploits elastic deformation to achieve a desired movement of the input structure and the output structure relative to the substrate. All movement the pivotless compliant microstructure is through a flexing of the same at/about one or more locations where the structure is anchored to the substrate. Unless otherwise noted as being a key requirement for a particular embodiment, each of the following characteristics for a pivotless compliant microstructure will be applicable. Any layout of interconnected beams may be used to define the pivotless compliant microstructure, each of these beams may be of any appropriate configuration, and the pivotless compliant microstructure may be anchored to the substrate using any appropriate number of anchor locations and anchor location positionings. The input and output structures of the pivotless compliant microstructure may be of any appropriate configuration, and further may be disposed in any appropriate orientation relative to each other. The pivotless compliant microstructure may be configured to achieve any type/amount of motion of its input structure relative to its output structure. For instance, the input and output structures of the pivotless compliant microstructure may move the same or different amounts in the lateral dimension, and along any appropriate path. In the case where the output structure of the pivotless compliant microstructure moves more than its input structure, the pivotless compliant microstructure may be referred to as a displacement multiplier. Therefore, a displacement multiplier is one type of pivotless compliant microstructure. Although the pivotless compliant microstructure may be symmetrically disposed relative to a reference axis, such need not be the case.

FIG. 1A illustrates a wafer 12 having a plurality of die 16. As will be discussed in more detail below, each die 16 may be of the same configuration. In any case, each adjacent pair of die 16 is separated by a die boundary 20. Each die 16 is defined by a single exposure field of a stepper. Therefore, as used herein the term "die" means an area that is encompassed by a single exposure field of a photolithographic stepper. In contrast, a "chip" as used herein means a continuous section of a wafer 12 that may be sawed, diced, or otherwise separated in any appropriate manner from the wafer 12. A chip may include all or a portion of one or more die in accordance with one or more aspects of the present invention.

An exemplary stepper capable of defining the die 16 on the wafer 12 of FIG. 1A is the Ultratech 1900 stepper manufactured by Ultratech Stepper, Inc., of San Jose, Calif. Any appropriate stepper may be utilized to define the various die 16 on the wafer 12. It should be noted that the wafer 12 also has a plurality of edge die 24 that define partial die patterns. The partial die 24 generally are not utilized in a product, but instead are usually discarded.

Figure 1B:
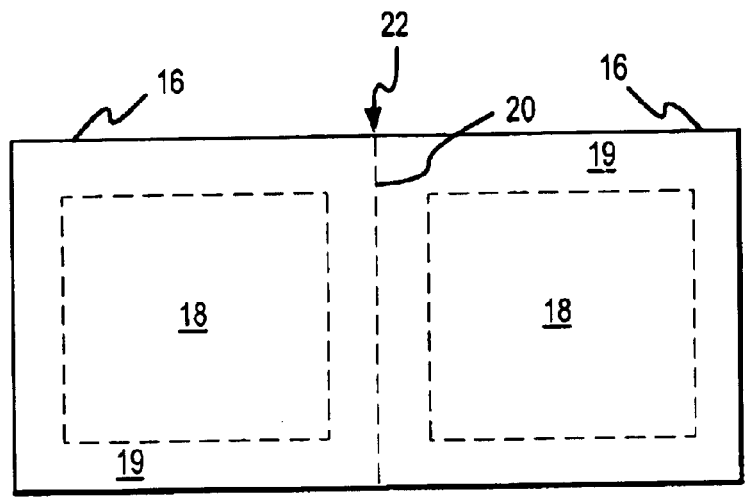
FIG. 1B is an enlarged plan view of a pair of die from the wafer of FIG. 1A.

FIG. 1B provides further details regarding one embodiment of a layout of a particular die 16 from the wafer 12. A microelectromechanical assembly is typically formed on only a certain portion of each die 16. That area of the die 16 that is occupied by a microelectromechanical assembly may be characterized as a device region 18. Each device region 18 of a given die 16 is surrounded by a die perimeter region 19. An inter-die region 22 is disposed between each adjacent pair of die 16, and is thereby defined by a portion of the die perimeter region 19 of each die 16 of the adjacent pair. The inter-die region 22 between each adjacent pair of die 16 is also commonly referred to in the art as a street or avenue. Alignment targets (not shown) for the stepper may be formed on the wafer 12. Adjacent die 16 on the wafer 12 may be diced from the wafer 12 by sawing along the appropriate inter-die regions 22 surrounding a given die 16. As will be discussed in more detail below, at least certain adjacent die 16 on the wafer 12 may be electrically interconnected and diced from the wafer 12 to define a multi-die chip. Therefore, one and more typically a plurality of electrical traces of a given die 16 will extend to a die boundary 20. Therefore, at least certain of the inter-die regions 22 in this case will be occupied by these electrical traces.

Figure 1C:
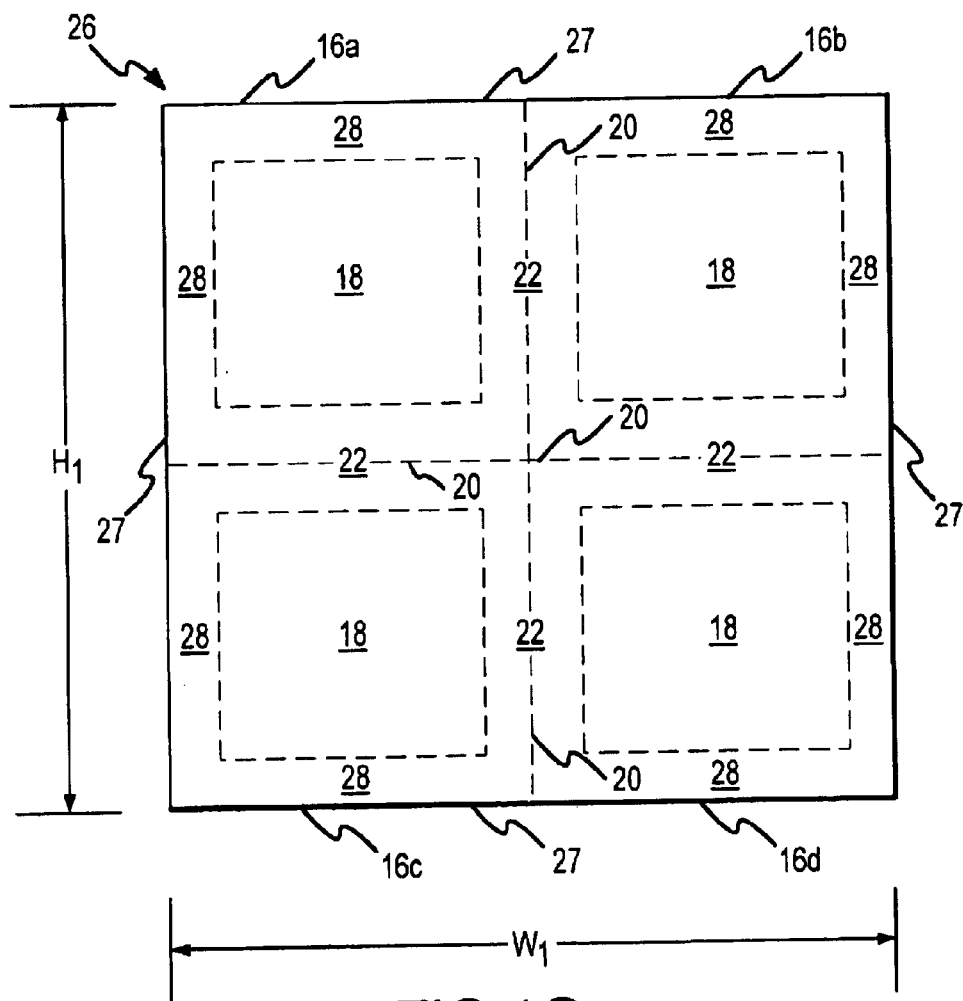
FIG. 1C is a plan view of one embodiment of a chip that may be diced from the wafer of FIG. 1A.

One embodiment of a chip 26 is illustrated in FIG. 1C that may be diced from the wafer 12 of FIG. 1A. The chip 26 includes four die 16 that were diced from the wafer 12 at least generally along the relevant die boundaries 20. Any appropriate number of die 16 may be used to define the chip 26 as will be discussed in more detail below in accordance with one or more aspects of the present invention. The chip 26 includes a chip perimeter 27 and a chip perimeter region 28 that is spaced inwardly from the chip perimeter 27. The chip perimeter region 28 is defined by that portion of a perimeter region 19 of a die 16 that does not abut a perimeter region 19 of another die 16. The chip 26 thereby includes multiple die 16a–d. The die 16a and 16b may be electrically interconnected based upon a tiling scheme to be discussed in more detail below, as may be the die 16c and 16d.

Figure 2:
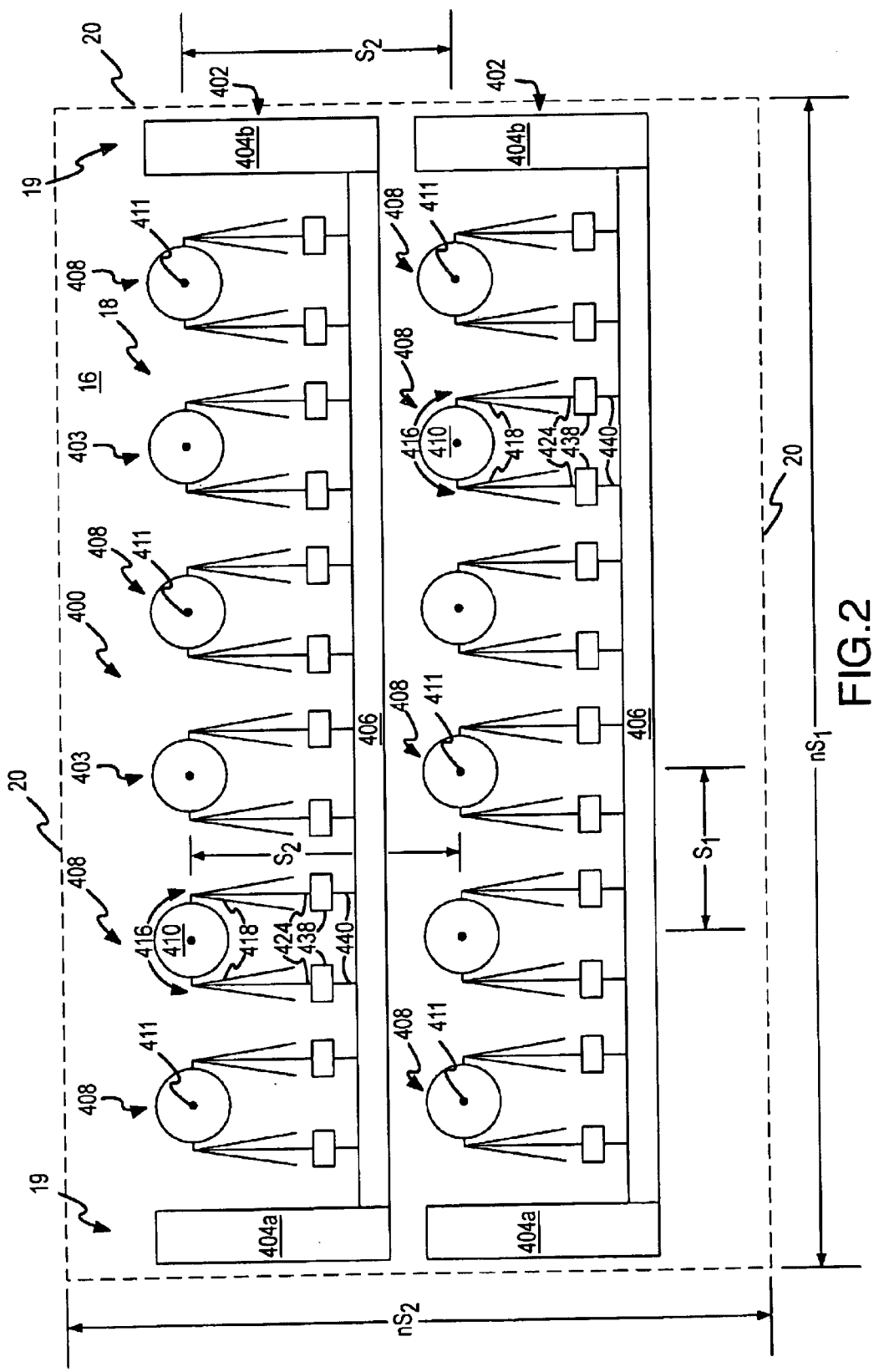
FIG. 2 is a plan view of one embodiment of a mirror array that may be formed on each die of the wafer of FIG. 1A.

One embodiment of at least a portion of a microelectromechanical system is illustrated in FIG. 2 in the form of a mirror array 400. Representative functions that may be performed by the mirror array 400 include optical switching, optical beam redirection, and optical attenuation or the like. This mirror array 400 may be formed within the device region 18 of a die 16 on the wafer 12 of FIG. 1A, and further may be formed within the device region 18 of each die 16a–d of the chip 26 of FIG. 1C. Although the mirror array 400 will be described in relation to the die 16, it may be fabricated on any die described herein.

The mirror array 400 of FIG. 2 includes a plurality mirror assemblies 408. Each mirror assembly 408 includes a mirror 410 and a positioning assembly 416 as will be discussed in more detail below in relation to FIG. 5. Generally, each positioning assembly 416 includes an elevator 418 that is interconnected with its corresponding mirror 410, and an actuation assembly 438 that is interconnected with its corresponding elevator 418 by a tether 424. Movement of the actuation assembly 438 relative to a substrate of the die 16 (that is used in the fabrication of the mirror array 400) moves its corresponding elevator 418, which in turn moves the interconnected portion of its corresponding mirror 410 to provide a desired optical function.

The mirror array 400 of FIG. 2 includes a plurality of rows 402 of a plurality of mirror assemblies 408 that define a width dimension for the array 400/die 16. Each row 402 is at least generally linearly extending, and preferably these rows 402 are disposed in at least generally parallel relation. In any case, the center 411 of the various mirrors 410 in each row 402 are disposed along a common reference line in the case of the array 400. The mirrors 410 are preferably equally spaced by an appropriate distance $S_1$ in each row 402, and preferably the same spacing $S_1$ is used in each row 402 of the array 400. In one embodiment, the width dimension of the die 16 (e.g., measured along a reference line that extends through the centers 411 of mirrors 410 in a given row 402) is an integer multiple of this same spacing $S_1$. This is represented in FIG. 2 by the dimension "$nS_1$", where "n" is an appropriate integer. The same would preferably apply to any chip 26 than includes the array 400 as well. That is, in one embodiment the width of such a chip 26, designated as $W_1$ in FIG. 1C and measured along a reference line that extends through the centers 411 of mirrors 410 in a given row 402 of the array 400, is preferably an integer multiple of this same inter-mirror spacing $S_1$.

The rows 402 of the mirror array 400 of FIG. 2 are also aligned so that the center 411 of one mirror 410 from each row 402 is also disposed along a common reference line that is perpendicular to the lateral extent of the rows 402 or the direction in which each of the rows 402 at least generally extend. That is, the mirror array 400 also includes a plurality of laterally spaced columns 403 that define a height dimension for the array 400/die 16/chip 26. The mirrors 410 in each column 403 are preferably equally spaced by an appropriate distance $S_2$. In one embodiment, the height dimension of the die 16 (e.g., measured along a reference line that extends through the centers 411 of mirrors 410 in a given row 403) is an integer multiple of this same spacing $S_2$. This is represented in FIG. 2 by the dimension "$nS_2$", where "n" is an appropriate integer. The same would preferably apply to any chip 26 than includes the array 400 as well. That is, in one embodiment the height of such a chip 26, designated as $H_1$ in FIG. 1C and measured along a reference line that extends through the centers 411 of mirrors 410 in a given column 403 of the array 400, is preferably an integer multiple of this same spacing $S_2$.

An off-chip electrical contact assembly 404a, 404b is disposed at least generally beyond each end of each row 402 of the mirror array 400 in the illustrated embodiment of FIG. 2, and nonetheless is disposed in the perimeter region 19 of the corresponding die 16. Each off-chip electrical contact assembly 404a, 404b may be disposed at any appropriate location within the die perimeter region 19 of the die 18 so long as each of its various off-chip electrical contacts (discussed in more detail below) are electrically interconnected with a specific single electrical path within a corresponding electrical trace bus 406 described below. In one embodiment, each off-chip electrical contact assembly 404a, 404b includes a plurality of pads for wire bonding, solder bump bonding, or the like.

An electrical trace bus 406 is located between each adjacent pair of rows 402 in the mirror array 400, typically extends between and is electrically interconnected with a pair of off-chip electrical contact assemblies 404a, 404b, and includes a plurality of individual electrical traces (not shown, but illustrated in subsequent embodiments). Each electrical trace bus 406 is electrically interconnected with only one row 402 of mirror assemblies 408 in the mirror array 400. That is, each row 402 of mirror assemblies 408 is electrically serviced by its own electrical trace bus 406. An electrical interconnect assembly 440 includes at least one electrical trace and extends from the relevant electrical trace bus 406 to the corresponding actuation assembly 438. The electrical interconnect assembly 440 may be characterized as being part of the electrical trace bus 452.

Any number of rows 402 may be defined on the device region 18 of a given die 16. In addition, each row 402 of the mirror array 400 may be defined by any number of mirror assemblies 408. Generally, the above-noted spacing of mirrors 410 within the rows 402 and between the mirrors 410 in each of the columns 403 defines a lattice or lattice-like structure for the mirror array 400 that may be desirable for one or more reasons. One benefit of this spacing is when multiple die 16, each having the mirror array 400 fabricated thereon, are diced from the wafer 12 to define a multi-die chip 26 with electrically interconnected die 16.

As will be discussed in more detail below in relation to tiling structures/techniques, each electrical trace bus 406 from one die 16 will be electrically connected with a different electrical trace bus 406 from an adjacently disposed die 16 on the wafer 12 and on any chip 26 that is includes these multiple die 16 when subsequently separated from the wafer 12. In the case of a chip 26 that is subsequently separated from the wafer 12, each actuation assembly 438 for each mirror assembly 408 may be separately electrically accessed from an off-chip electrical contact assembly 404a, 404b that will be disposed within a chip perimeter region 28 of this chip 26. That is, regardless of whether a chip 26 includes all or part of a single die 16 having an array 400 formed thereon or multiple full/partial die 16 having an array 400 formed thereon that extend within a row on the chip 26 and that are electrically interconnected in a manner that will be discussed in more detail below, each actuation assembly 438 on the chip 26 may be individually accessed from the chip perimeter region 28 via the most outwardly disposed off-chip electrical contact assembly 404a (that which is disposed at least generally at one end of any such row of die 16), or the most outwardly disposed off-chip electrical contact assembly 404b (that which is disposed at least generally at the opposite end of any such row of die 16). A single, different off-chip electrical contact from either the off-chip electrical contact assembly 404a or 404b is electrically interconnected with a single electrical path that leads to each electrical load-based microstructure of the actuation assembly 438 (e.g., each actuator 426 per FIG. 5 to be discussed in more detail below). Preferably, there are an even number of electrical traces in each electrical trace bus 406 so that one half of the noted electrical load-based microstructures that are electrically interconnected with a particular electrical trace bus 406 on a chip 26 may be accessed from the most outwardly disposed off-chip electrical contact assembly 406a on the chip 26 and such that the other half of the noted electrical load-based microstructures that are electrically interconnected with a particular bus 406 on the chip 26 may be accessed from the most outwardly disposed off-chip electrical contact assembly 406b on the chip 26. As such, the maximum required width along any portion of any electrical trace bus 406 included on a chip 26 is ½ the number of electrical load-based microstructures on the chip 26 that are electrically interconnected with this particular bus 406. The various features presented in this paragraph will be equally applicable to the mirror arrays 442 and 462 of FIGS. 3–4, respectively. A discussion of each of these arrays 442, 462 follows.

Figure 3:
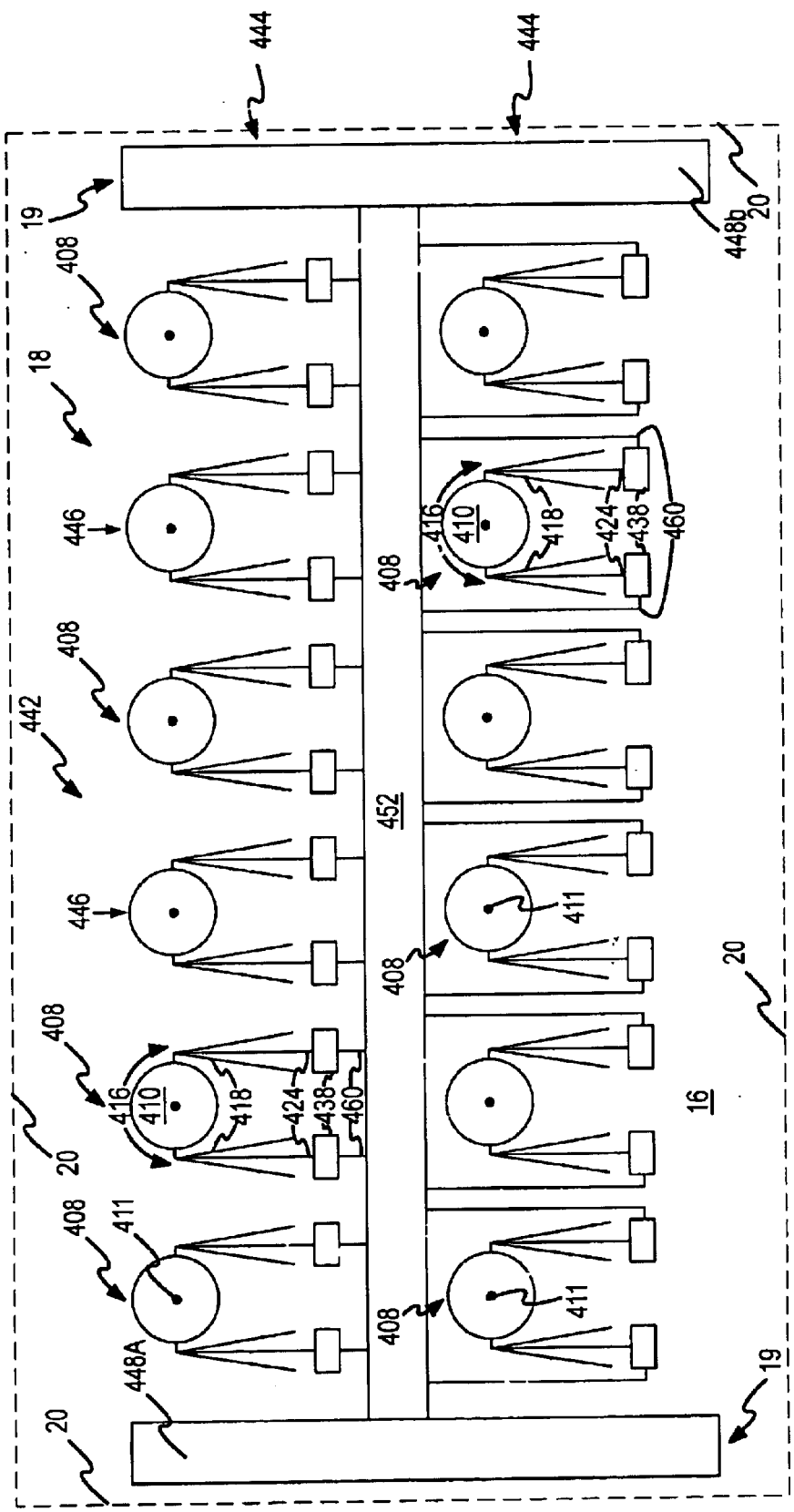
FIG. 3 is a plan view of another embodiment of a mirror array that may be formed on each die of the wafer of FIG. 1A.

Another embodiment of at least a portion of a microelectromechanical system is illustrated in FIG. 3 in the form of a mirror array 442. The mirror array 442 of FIG. 3 may provide the same types of functions discussed above in relation to the mirror array 400 of FIG. 2. This mirror array 442 may be formed within the device region 18 of a die 16 on the wafer 12 of FIG. 1A, and further may be formed within the device region 18 of each die 16 of the chip 26 of FIG. 1C. Although the mirror array 442 will be described in relation to the die 16, it may be fabricated on any other die described herein.

The mirror array 442 of FIG. 3 includes a plurality of rows 444 of a plurality of the above-noted mirror assemblies 408 that define a width dimension for the array 442/die 16. Each row 444 is at least generally linearly extending. That is, the center 411 of the mirrors 410 in each row 444 are disposed along a common reference line. Preferably, the mirrors 410 in each row 444 of the mirror array 442 are spaced in the same manner discussed above in relation to the mirrors 410 in the various rows 402 of the mirror array 400 of FIG. 2 and for the same rationale.

The rows 444 of the mirror array 442 of FIG. 3 are also aligned so that the center 411 of one mirror 410 from each row 444 is also disposed along a common reference line that is perpendicular to the lateral extent of the rows 444. That is, the mirror array 442 also includes a plurality of laterally spaced 446 columns that define a height dimension for the array 442/die 16. In the case where the array 442 includes at least four rows 444 of mirror assemblies 408, and thereby at least two electrical trace buses 452 (only one shown in FIG. 3), the spacing between adjacent electrical trace buses 452 (e.g., a "center-to-center" distance between each adjacent pairs of electrical trace buses 452, and hereafter an "inter-bus spacing" of sorts) may be used to define a height for the die 16 including the array 442 or a chip 26 that includes at least one die 16 that includes an array 442. In one embodiment, the height dimension of the die 16 (e.g., measured along a reference line that extends through the centers 411 of mirrors 410 in a given column 446) is an integer multiple of this same inter-bus spacing. The same could preferably apply to any chip 26 than includes the array 442 as well (i.e., the height of such a chip 26, designated as H₁ in FIG. 1C and measured along a reference line that extends through the centers 411 of mirrors 410 in a given column 446 of the array 442 of FIG. 3, is preferably an integer multiple of the noted inter-bus spacing).

An off-chip electrical contact assembly 448a, 448b is disposed at least generally beyond each end of each row 444 of the mirror array 442 in the illustrated embodiment, and nonetheless is disposed in the perimeter region 19 of the corresponding die 16. Each off-chip electrical contact assembly 408a, 408b may be disposed at any appropriate location within the perimeter region 19 of the die 18 so long as each of its various off-chip electrical contacts are electrically interconnected with a specific single electrical path within a corresponding electrical trace bus 452. Each off-chip electrical contact assembly 448 may include the type of structures discussed above in relation to the off-chip electrical contact assemblies 404 of the mirror array 400 of FIG. 2.

An electrical trace bus 452 is located between each adjacent pair of rows 444, typically extends between and is electrically interconnected with a pair of off-chip electrical contact assemblies 448a, 448b, and includes a plurality of individual electrical traces (not shown, but illustrated in subsequent embodiments). Each electrical trace bus 452 is electrically interconnected with both rows of an adjacent pair of rows 444 of mirror assemblies 408. That is, two rows 444 of mirror assemblies 408 are electrically serviced by the same electrical trace bus 452 in the case of the mirror array 442 of FIG. 3. An electrical interconnect assembly 460 includes at least one electrical trace and extends from the electrical trace bus 452 to the corresponding actuation assembly 438. The electrical interconnect assembly 460 may be characterized as being part of the electrical trace bus 452.

Any number of rows 444 may be defined on the device region 18 of a given die 16. However, preferably an even number of rows 444 of mirror assemblies 408 are defined on the device region 18 of a given die 16 so as to retain both rows 444 of mirror assemblies 408 that are associated with a given electrical trace bus 452. In addition, each row 444 of the mirror array 442 may be defined by any number of mirror assemblies 408. Once again, the mirror array 442 may utilize the various mirror spacings discussed above in relation to the mirror array 400 of FIG. 2 and for the same purpose(s).

Figure 4:
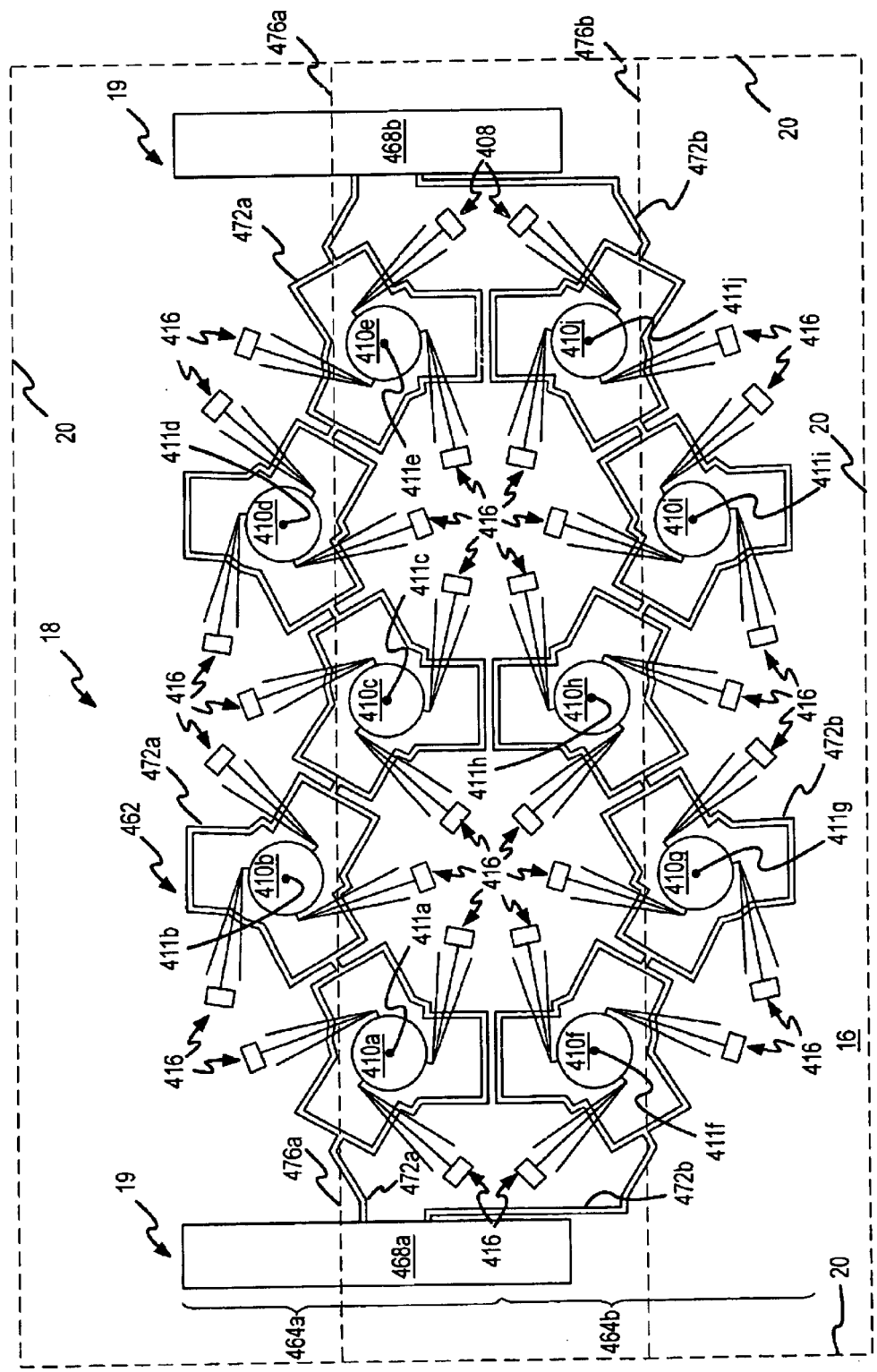
FIG. 4 is a plan view of another embodiment of a mirror array that may be formed on each die of the wafer of FIG. 1A.

Another embodiment of at least a portion of a microelectromechanical system is illustrated in FIG. 4 in the form of a mirror array 462. The mirror array 462 of FIG. 4 may provide the same types of functions discussed above in relation to the mirror array 400 of FIG. 2. This mirror array 462 may be formed within the device region 18 of a die 16 on the wafer 12 of FIG. 1A, and further may be formed within the device region 18 of each die 16 of the chip 26 of FIG. 1C. Although the mirror array 462 will be described in relation to the die 16, it may be fabricated on any other die described herein.

The mirror array 462 of FIG. 4 includes a plurality of mirrors 410 and mirror positioning assemblies 416, a pair of off-chip electrical contact assemblies 468a, 468b, and a pair of electrical trace buses 472a, 472b. Although the illustrated embodiment discloses having two electrical trace buses 472a, 472b accessed from a pair of off-chip electrical contact assemblies 468a, 468b, any number of electrical trace buses 472 may be accessed by any given pair of off-chip electrical contact assemblies 468a, 468b. In fact, it may be possible to utilize only a single off-chip electrical contact assembly 468 for one or more electrical trace buses 472, again so long as each of its various off-chip electrical contacts are electrically interconnected with a specific single electrical path within a corresponding electrical trace bus 472.

The off-chip electrical contact assemblies 468a, 468b would typically be disposed within the perimeter region 19 of the die 16. Each electrical trace bus 472 provides an electrical interconnection between the relevant off-chip electrical contact assembly 468a, 468b and the corresponding mirror positioning assemblies 416. More specifically, the electrical trace bus 472a provides an electrical path from the relevant off-chip electrical contact assembly 468a, 468b to each of the mirror positioning assemblies 416 associated with mirrors 410a–e, while the electrical trace bus 472b provides power from the relevant off-chip electrical contact assembly 468a, 468b to each of the mirror positioning assemblies 416 associated with mirrors 410f–j. The electrical trace bus 472a is routed between the pair of off-chip electrical contact assemblies 468a, 468b so as to encircle each individual mirror 410a–e of the corresponding mirror positioning assemblies 416 that are electrically interconnected with the electrical trace bus 472a. Similarly, the electrical trace bus 472b is routed between the pair of off-chip electrical contact assemblies 468a, 468b so as to encircle each individual mirror 410f–j of the corresponding mirror positioning assemblies 416 that are electrically interconnected with the electrical trace bus 472b.

The electrical trace bus 472a and the mirror positioning assemblies 416 associated with the mirrors 410a–e may be characterized as collectively defining a row 464a, while the electrical trace bus 472b and the mirror positioning assemblies 416 associated with the mirrors 410f–j may be characterized as collectively defining a row 464b. Preferably, the mirrors 410 in each row 464 of the mirror array 462 are spaced in a direction that is parallel with reference lines 476a, 476b in the same manner discussed above in relation to the mirrors in the various rows 402 of the mirror array 400 of FIG. 2 and for the same rationale. Any number of rows 464 may be defined on the device region 18 of a given die 16. Moreover, each row 464 of the mirror array 442 may be defined by any number of mirrors 410.

Another feature of the mirror array 462 of FIG. 4 is that the mirrors 410 in each row 464 are alternately disposed on opposite sides of a corresponding reference line 476. That is, the mirrors 410a, 410c and 410e in row 464a are disposed on one side of the reference line 476a, while the mirrors 410b, 410d in row 464a are disposed on the opposite side of the reference line 476a. Similarly, the mirrors 410f, 410h, and 410j in row 464b are disposed on one side of the reference line 476b, while the mirrors 410g, 410i in row 464b are disposed on the opposite side of the reference line 476b. Yet another feature of the mirror array 462 is that the centers 411 of a plurality of groups of the mirrors 410 are disposed on a common reference circle. Mirrors 410a, 410b, 410c, 410h, 410g, and 410f have their corresponding centers 411 disposed on one common reference circle. Similarly, mirrors 410c, 410d, 410e, 410j, 410i, and 410h have their corresponding centers 411 disposed on a different common reference circle.

Figure 5:
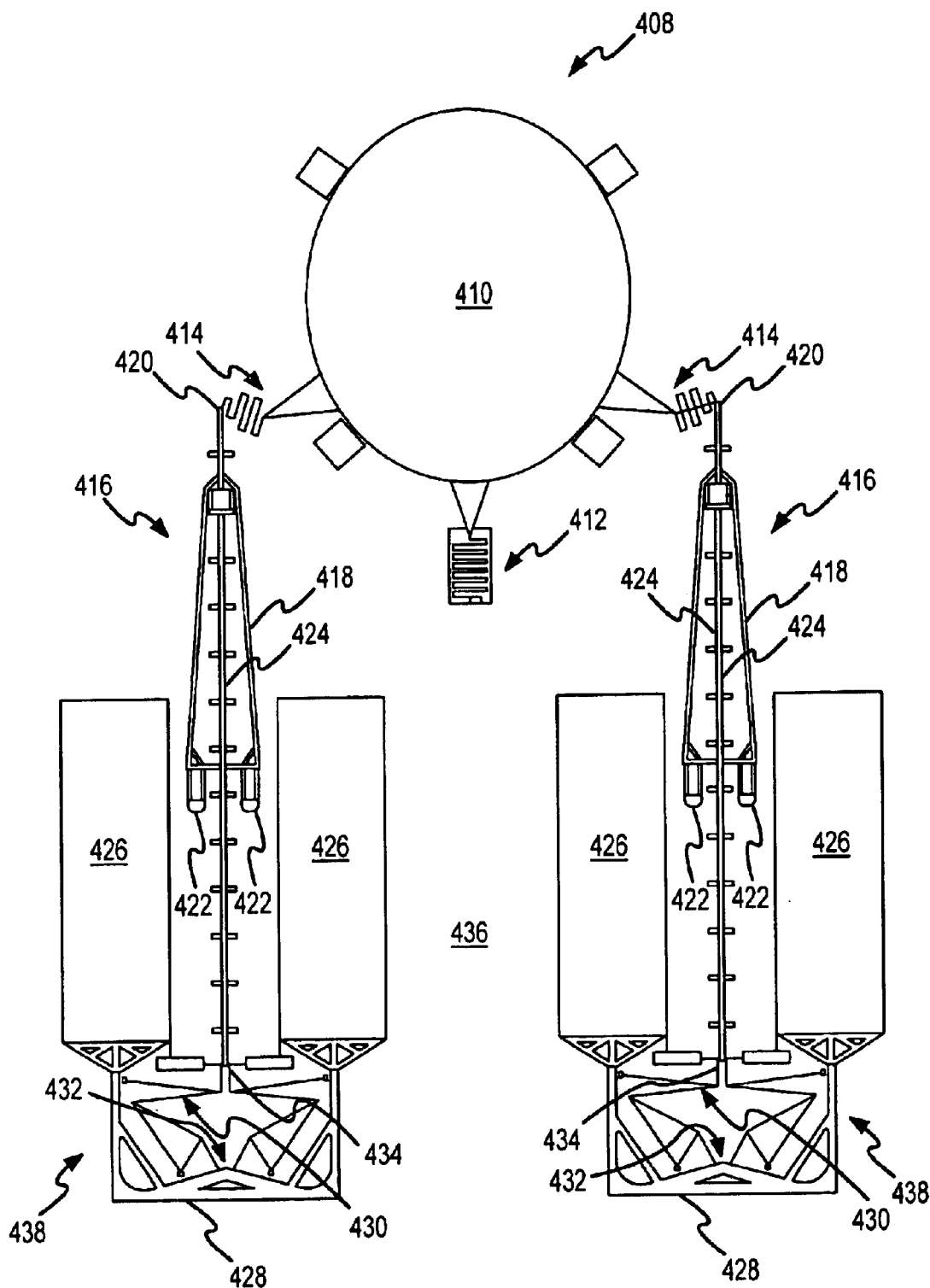
FIG. 5 is an enlarged plan view of one embodiment of a mirror assembly that may be utilized by any of the mirror arrays of FIGS. 2–4.

Details are presented in FIG. 5 regarding the configuration of the types of positioning assemblies 416 for the mirrors 410 that may be used by the mirror arrays 400, 442, and 462. The mirror assembly 408 generally includes a mirror 410 and a pair of positioning assemblies 416 that are fabricated using an appropriate substrate 436. The mirror 410 is interconnected with the substrate 436 by a substrate interconnect 412 of any appropriate type (e.g., an appropriately configured compliant member/spring). The mirror 410 may be interconnected with the substrate 412 in any appropriate manner in order to realize a desired movement of the mirror 410 relative to the substrate 436 depending upon the position of each of the positioning assemblies 416. The mirror 410 in fact need not be directly interconnected with the substrate 436 at all.

Each positioning assembly 416 generally includes an actuation assembly 438 that may be of any appropriate configuration. The embodiment of the actuation assembly 438 illustrated in FIG. 5 includes pair of actuators 426 that are collectively interconnected with an input structure 432 of a displacement multiplier 430. Power for each of the actuators 426 is provided by the types of electrical interconnect assemblies 440, 460, 476 discussed above in relation to the mirror arrays 400, 442, and 462 of FIGS. 2–4, respectively. Each positioning assembly 416 further includes a tether or coupling 424 an elevator 418. In this regard, an output structure 434 of the displacement multiplier 430 is interconnected with one end of the tether 424. The opposite end of the tether 424 in turn is interconnected with a portion of the elevator 418 that is able to move at least generally away from or toward the substrate 436, depending upon the direction of motion of the actuators 426 relative to the substrate 436. This movable portion of the elevator 418 in turn is interconnected with the mirror 410 by at least one elevator interconnect 414 of any appropriate type and at any appropriate location.

The actuators 426 may be of any appropriate type for microelectromechanical applications. Both actuators 426 are interconnected with the substrate 436 in any appropriate manner for movement at least generally in a lateral dimension (at least generally parallel to the lateral extent of the substrate 436). One or more electrical traces extend from the electrical trace bus of the mirror array to each of the actuators 426. Movement of the actuators 426 relative to the substrate 436 is transferred to a common output yoke 428 or the like. Although a pair of actuators 426 are disclosed for each positioning assembly 416, the number of actuators 426 per positioning assembly 416 is not of particular importance in relation to the present invention.

The output yoke 428 is appropriately interconnected with the input structure 432 of the displacement multiplier 430. The output structure 434 of the displacement multiplier 430 again is interconnected with the tether 424. The displacement multiplier 430 may be of any appropriate configuration to achieve a desired relative motion at least generally in the lateral dimension between the input structure 432 and the output structure 434. Generally, the input structure 432 and the output structure 434 each move relative to the substrate 436 by a flexing of those beams of the displacement multiplier 430 that are anchored to the substrate 436. Displacement multipliers are described in U.S. Pat. No. 6,174,179 to Kota et al. and issued on Jan. 16, 2001, the entire disclosure of which is incorporated by reference herein.

Movement of the output structure 434 of the displacement multiplier 430 is transferred to the elevator 418 by the tether 424. The elevator 418 may be of any appropriate configuration. Generally, the elevator 418 includes a free end 420 that is able to move at least generally away from or toward the substrate 436 along an appropriate path, depending upon the direction of the motion of the actuators 426. This motion may be characterized as being at least generally of a pivotal-like nature in that the free end 420 of the elevator 418 moves at least generally about an axis that extends through a pair of anchors 422 where the elevator 418 is fixed to the substrate 436. Flexures or the like may be used to interconnect the elevator 418 with the anchors 422. This motion is then transferred to the mirror 410 by the corresponding elevator interconnect(s) 414. It should be appreciated that the mirror 410 may be disposed in a variety of positions relative to the substrate 436 depending upon the position of the free end 420 of each of the elevators 418, where the elevators 418 interconnect with the mirror 410, and where, if at all, the mirror 410 is interconnected with the substrate 436.

The process of creating a layout for the mirror arrays 400, 442, and 462 of FIGS. 2–4, respectively, on a die 16, or at least their corresponding electrical trace bus(es) 406, 452, 472, can be rather complex and susceptible to the inclusion of errors in the layout that may adversely affect the operation of the mirror arrays 400, 442, and 462 that may be ultimately fabricated on the wafer 12 (FIG. 1) and included on a chip 26 (FIG. 1C). Various embodiments that address these types of issues are illustrated in FIGS. 6–17.

Figure 6:
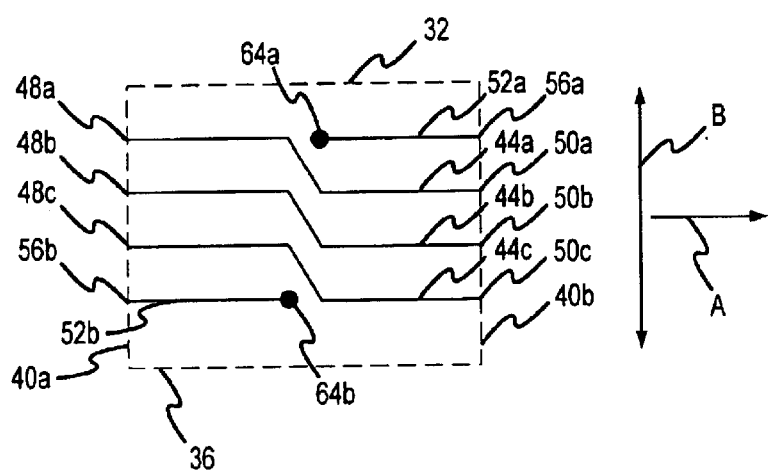
FIG. 6 is a plan view of one embodiment of a unit cell that may be tiled so as to define at least a portion of each of the mirror arrays of FIGS. 2–4.

One embodiment of a unit cell 32 is illustrated in FIG. 6. The unit cell 32 may be viewed as a building block of sorts for creating a layout for the types of mirror arrays 400, 442 and 462 discussed above in relation to FIGS. 2–4 or at least their corresponding electrical trace bus(es) 406, 452, 472. Generally, the unit cell 32 is an enclosed space that is defined by a unit cell boundary 36. The unit cell boundary 36 may be of any appropriate shape. At least one pass-through electrical trace assembly 44, at least one microstructure electrical trace assembly 52, and at least one microstructure assembly 64 are disposed within the unit cell 32. One off-chip electrical contact (not shown) will typically be electrically connected with each single, individual electrical path that extends within the unit cell 32. Although these off-chip electrical contacts are not actually within the unit cell 32 in the illustrated embodiment, nonetheless each such off-chip electrical contact will be associated with a different single electrical path within the cell 32 by being electrically interconnected therewith in any appropriate manner. As such, it at least some cases not all elements of a particular microelectromechanical system will typically be created by a layout using a tiling of the unit cell 32. Instead, typically one or more elements will have to be separately created to complete the layout of a desired microelectromechanical system.

Each pass-through electrical trace assembly 44 may be either a single electrical trace or may be representative of multiple electrical traces. Similarly, each microstructure electrical trace assembly 52 may be either a single electrical trace or may be representative of multiple electrical traces. Each microstructure assembly 64 may either be a single electrical load (e.g., a single actuator) or may be representative of multiple electrical loads (e.g., multiple actuators). The unit cell 32 may be used to define the mirror arrays 400, 442, 462 of FIGS. 2–4. In this case where the microstructure assembly 64 would then be representative of the mirror assembly 408 discussed above in relation to FIG. 5 and utilized by the mirror arrays 400, 442, and 462 of FIGS. 2–4, the microstructure assembly 64 would be representative of two electrical loads (since there are two actuators 426 for each mirror assembly 408 (and each of which is an electrical load-based microstructure as noted above for purposes of the present invention), and each of the trace assemblies 44, 52 in FIG. 6 would then be representative of two electrical traces.

Each pass-through electrical trace assembly 44 includes a pair of ends 48, 50 that are spaced in a direction in which the unit cell 32 may be tiled (represented by the arrow A in FIG.

6) and that are disposed on a unit cell boundary 36. Similarly, each microstructure electrical trace assembly 52 includes an end 56 that is also disposed on the unit cell boundary 36. An opposite end of each microstructure electrical trace assembly 52 terminates within the unit cell 32 at one of the microstructure assemblies 64. Where the plurality of ends 48 of the various pass-through electrical trace assemblies 44 and the ends 56 of any adjacently disposed microstructure electrical trace assemblies 52 terminate collectively define one unit cell side 40a of the unit cell boundary 36 of the unit cell 32. Although the unit cell side 40a is linear in the illustrated embodiment, it may be of any appropriate shape. Where the plurality of ends 50 of the various pass-through electrical trace assemblies 44 and the ends 56 of any adjacently disposed microstructure electrical trace assemblies 52 terminate collectively define another unit cell side 40b of the unit cell boundary 36 of the unit cell 32 that is spaced from the unit cell side 40a in the direction of the tiling represented by arrow A. Although the unit cell side 40b is linear in the illustrated embodiment, it may be of any appropriate shape.

A number of boundary conditions exist for the unit cell 32 that allows a plurality of unit cells 32 (e.g., cells 32a, 32b, and 32c in FIG. 7 that is discussed below) to be tiled by translation in the direction of the arrow A in FIG. 6. More specifically, these boundary conditions for the unit cell 32 at the unit cell sides 40a, 40b allow the unit cell 32 to be tiled in a manner that electrically interconnects the trace assemblies 44, 52 of one unit cell 32 with the appropriate trace assembly 44, 52 of an adjacent unit cell 32 in the direction of the tiling. These boundary conditions are that: 1) the ends 48 and 50 of each pass-through electrical trace assembly 44 must be offset in a direction that is orthogonal (represented by arrow B in FIG. 6) to the direction in which the unit cell 32 is to be tiled (represented by reference line A in FIG. 6); 2) the end 56 of each microstructure electrical trace assembly 52 on the unit cell side 40b must be disposed along a common reference line with an end 48 of one of the pass-through electrical trace assemblies 44 on the unit cell side 40a, where this common reference line is parallel to the direction in which the unit cell 32 is to be tiled (arrow A); 3) the end 56 of each microstructure electrical trace assembly 52 on the unit cell side 40a must be disposed along a common reference line with an end 50 of one of the pass-through electrical trace assemblies 44 on the unit cell side 40b, where this common reference line is parallel to the direction in which the unit cell 32 is to be tiled (arrow A); 4) each end 48 of each pass-through electrical trace assembly 44 on the unit cell side 40a must be disposed along a common reference line with either an end 50 of a different pass-through electrical trace assembly 44 on the unit cell side 40b or an end 56 of one of the microstructure electrical trace assemblies 52 on the unit cell side 40b, where this common reference line is parallel to the direction in which the unit cell 32 is to be tiled (arrow A); and 5) each end 50 of each pass-through electrical trace assembly 44 on the unit cell side 40b must be disposed along a common reference line with either an end 48 of a different pass-through electrical trace assembly 44 on the unit cell side 40a or an end 56 of one of the microstructure electrical trace assemblies 52 on the unit cell side 40a, where this common reference line is parallel to the direction in which the unit cell 32 is to be tiled (arrow A).

Figure 7:
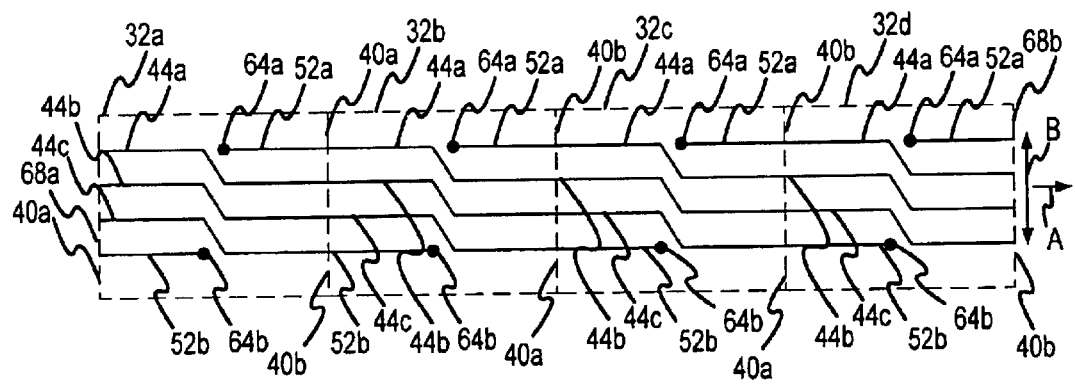
FIG. 7 is a plan view of a plurality of tiled unit cells from FIG. 6.

FIG. 7 illustrates four unit cells 32a–d that have been tiled together to define a tiled structure 66. This tiled structure 66 may be representative of a portion of one row of die 16 on the chip 26 of FIG. 1C. Generally, the side 40a of unit cell 32b is disposed in abutting relation to the side 40b of unit cell 32a (the unit cell 32b having been tiled by translation from the unit cell 32a in the direction of the arrow A), the side 40a of unit cell 32c is disposed in abutting relation to the side 40b of the unit cell 32b (the unit cell 32c having been tiled by translation from the unit cell 32b in the direction of the arrow A), and the side 40a of unit cell 32d is disposed in abutting relation to the side 40b of the unit cell 32c (the unit cell 32d having been having been tiled by translation from unit cell 32c in the direction of the arrow A). Based upon the above-noted configuration of the unit cell 32, each of the microstructure assemblies 64a, 64b in each of the unit cells 32a–d are accessible from either a perimeter or perimeter region 68a or a perimeter or perimeter region 68b of the tiled structure 66. That is: 1) pass-through trace assembly 44a of unit cell 32a terminates at the perimeter region 68a and is interconnected with pass-through electrical trace assembly 44b of unit cell 32b, which in turn is interconnected with pass-through electrical trace assembly 44c of unit cell 32c, which in turn is interconnected with microstructure electrical trace assembly 52b of unit cell 32d, which in turn is interconnected with microstructure assembly 64b of unit cell 32d; 2) pass-through trace assembly 44b of unit cell 32a terminates at the perimeter region 68a and is interconnected with pass-through electrical trace assembly 44c of unit cell 32b, which in turn is interconnected with microstructure electrical trace assembly 52b of unit cell 32c, which in turn is interconnected with microstructure assembly 64b of unit cell 32c; 3) pass-through trace assembly 44c of unit cell 32a terminates at the perimeter region 68a and is interconnected with microstructure electrical trace assembly 52b of unit cell 32b, which in turn is interconnected with microstructure assembly 64b of unit cell 32b; 4) microstructure electrical trace assembly 52b of unit cell 32a terminates at the perimeter region 68a and is interconnected with the microstructure assembly 64b of unit cell 32a; 5) pass-through trace assembly 44c of unit cell 32d terminates at the perimeter region 68b and is interconnected with pass-through electrical trace assembly 44b of unit cell 32c, which in turn it is interconnected with pass-through electrical trace assembly 44a of unit cell 32b, which in turn is interconnected with microstructure electrical trace assembly 52a of unit cell 32a, which in turn is interconnected with microstructure assembly 64a of unit cell 32a; 6) pass-through trace assembly 44b of unit cell 32d terminates at the perimeter region 68b and is interconnected with pass-through electrical trace assembly 44a of unit cell 32c, which in turn is interconnected with microstructure electrical trace assembly 52a of unit cell 32b, which in turn is interconnected with microstructure assembly 64a of unit cell 32b; 7) pass-through trace assembly 44a of unit cell 32d terminates at the perimeter region 68b and is interconnected with microstructure electrical trace assembly 52a of unit cell 32c, which in turn is interconnected with microstructure assembly 64a of unit cell 32c; and 8) microstructure electrical trace assembly 52a of unit cell 32d terminates at the perimeter region 68b and is interconnected with the microstructure assembly 64a of unit cell 32d. This again is possible by having a different off-chip electrical contact associated with each individual electrical path within the unit cell 32. However, at least some of these off-chip electrical contacts may simply be passive electrodes.

The configuration of a particular unit cell 32, namely the individual electrical paths therein, assumes that no more than a predetermined number of unit cells 32 will be tiled together. That is, so long as the layout of any chip 26 includes no more than this predetermined number of unit cells 32 to define a chip width (again represented by dimension $W_1$ in FIG. 1C), each of the microstructure assemblies 64a, 64b in each of the tiled unit cells 32 will be accessible from either a perimeter or perimeter region 68a or a perimeter or perimeter region 68b of the tiled structure 66. If less than this predetermined number of unit cells 32 are utilized by a given chip 26, one or more of the pass-through electrical trace assemblies 44 will pass through the entire collection of tiled unit cells 32 without connecting with any microstructure assembly 64.

In addition to allowing for establishment of a desired electrical interconnection between adjacently tiled unit cells 32 and for perimeter access of each of the microstructure assemblies 64 in the tiled structure 66, the configuration of the unit cell 32 also desirably minimizes the width of the electrical bus (the collection of pass-through electrical trace assemblies 44 and device electrical trace assemblies 52 that progress through the tiled structure 66). The maximum required width of this electrical bus, or stated another way the maximum number of electrical trace assemblies 44 at any location in the tiled structure 66, is ½ the total number of microstructure assemblies 64 that are included in the tiled structure 66.

Figure 8:
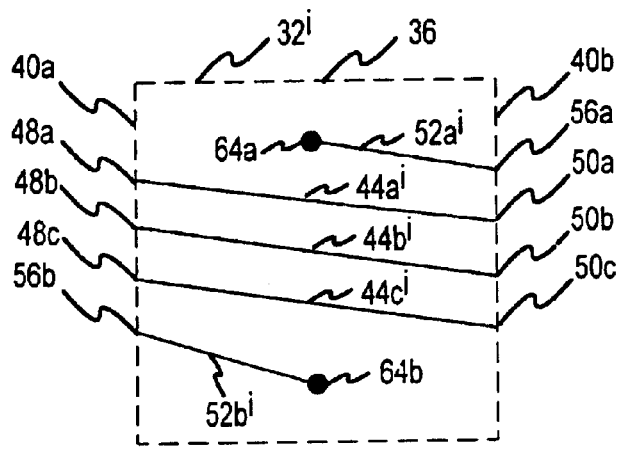
FIGS. 8–10 are a plans view of alternative embodiments of a unit cell that may be tiled.
Figure 9:
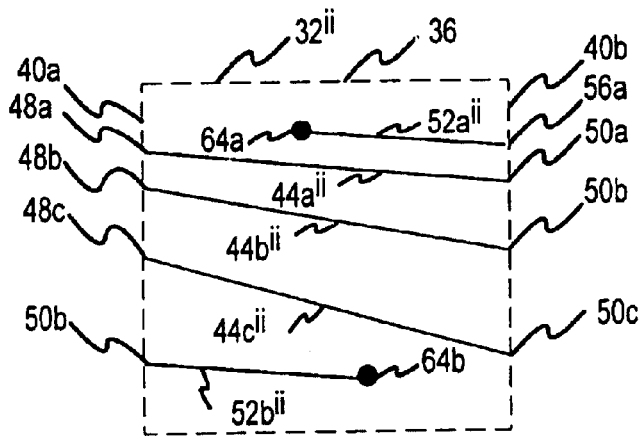
Figure 10:
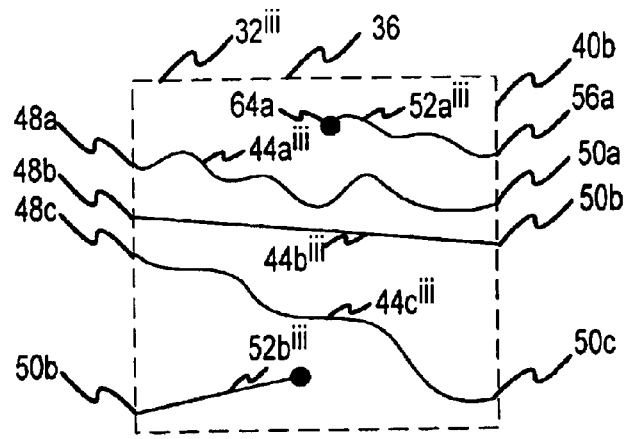

So long as the above-noted boundary conditions exist for the unit cell 32, how the pass-though electrical trace assemblies 44 and the microstructure electrical trace assemblies 52 are routed within the interior of the unit cell 32, as well as the location of any microstructure assembly 64 within the unit cell 32, is not of particular relevance and does not have an effect on the above-noted interconnect scheme that is realized by the above-noted tiling of the unit cell 32. Representative alternative embodiments for routing the pass-though electrical trace assemblies 44 and the microstructure electrical trace assemblies 52 are illustrated in FIGS. 8–10, where corresponding components with the FIG. 6 embodiment are identified by the same reference numerals, and where an appropriate "superscripted" designation is utilized to denote the existence of one or more differences from the FIG. 6 embodiment.

Figure 11:
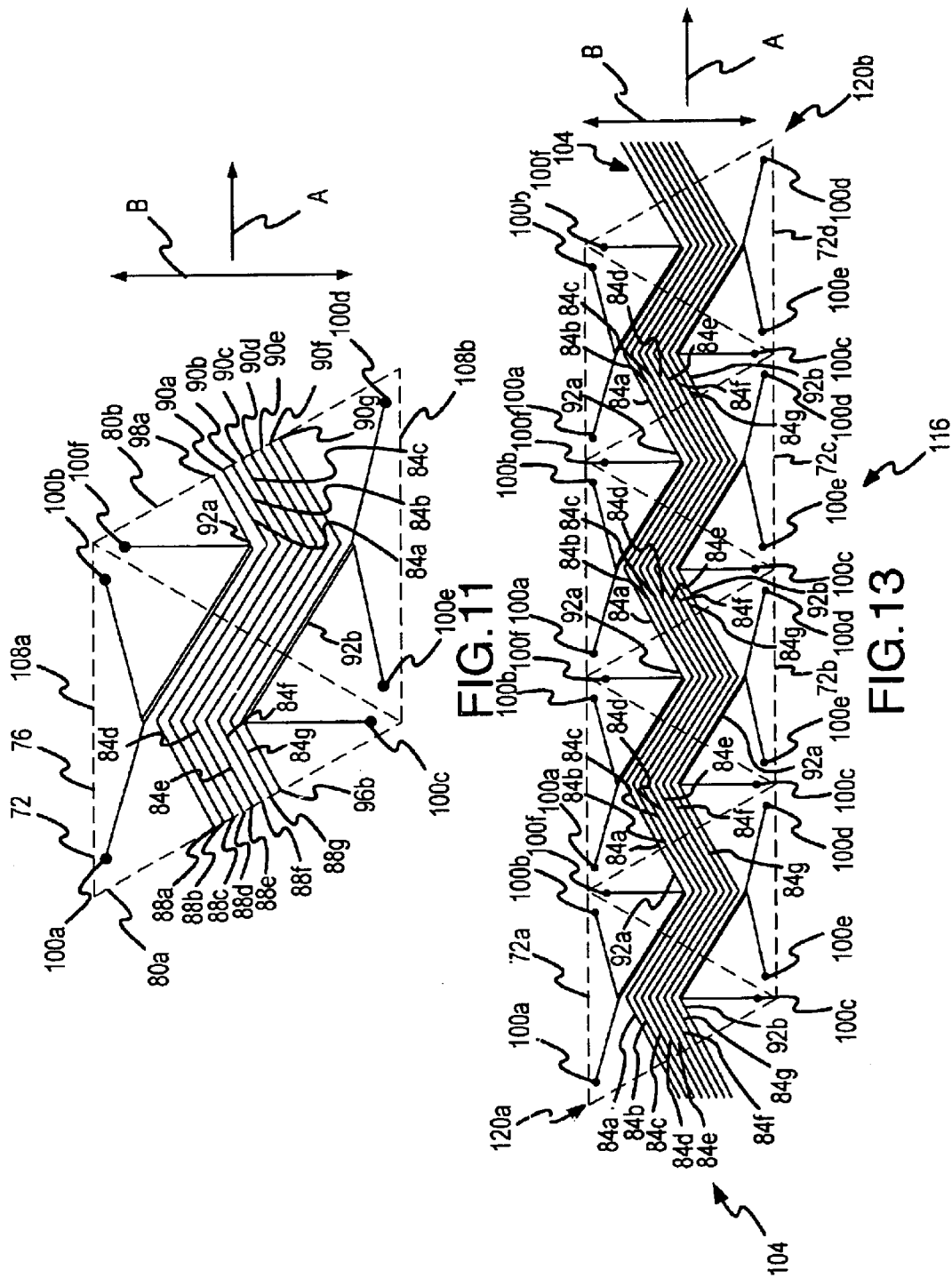
FIG. 11 is a plan view of another embodiment of a unit cell that may be tiled so as to define at least a portion of each of the mirror arrays of FIGS. 2–4.
Figure 12:
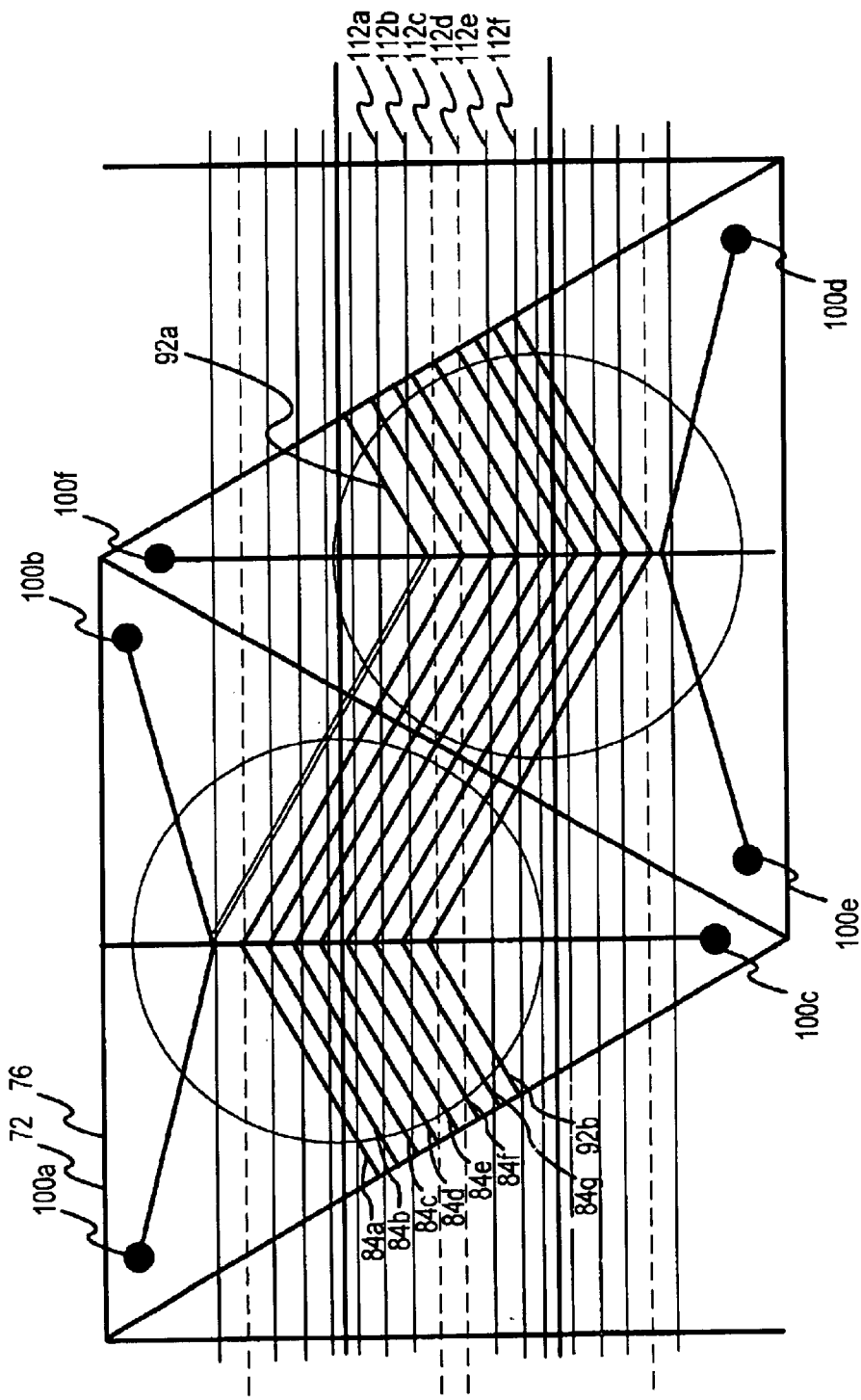
FIG. 12 is an enlarged view of that presented in FIG. 11.

Another embodiment of a unit cell 72 is illustrated in FIGS. 11–12. The unit cell 72 may be viewed as a building block for creating a layout for the types of mirror arrays 400, 442 and 462 discussed above in relation to FIGS. 2–4 or at least their corresponding electrical trace bus(es) 406, 452, 472. Generally, the unit cell 72 is an enclosed space that is defined by a unit cell boundary 76. The unit cell boundary 76 may be of any appropriate shape. At least one pass-through electrical trace assembly 84, at least one microstructure electrical trace assembly 92, and at least one microstructure assembly 100 are disposed within the unit cell 72. One off-chip electrical contact (not shown) will typically be electrically connected with each single, individual electrical path within the unit cell 72 in the manner discussed above in relation to the unit cell 32. Each such off-chip electrical contact will thereby be associated with a different single electrical path within the cell 72 by being electrically interconnected therewith in any appropriate manner. As such, in at least some cases not all elements of a microelectromechanical system will typically be created by a layout using a tiling of the unit cell 72. Instead, typically one or more elements will have to be separately created to complete the layout of a desired microelectromechanical system.

Each pass-through electrical trace assembly 84 may be either a single electrical trace or may be representative of multiple electrical traces. Similarly, each microstructure electrical trace assembly 92 may be either a single electrical trace or may be representative of multiple electrical traces.

In the illustrated embodiment, each microstructure trace assembly 92 is depicted as three electrical traces or 3 groups of electrical traces (with an appropriate number of electrical traces in each group) that extend to either each of the microstructure assemblies 100a, 100b, 100f or the microstructure assemblies 100c, 100e, 100d. Each microstructure assembly 100 may either be a single electrical load (e.g., a single actuator) or may be representative of multiple electrical loads (e.g., multiple actuators). The unit cell 72 may be used to define the mirror arrays 400, 442, 462 of FIGS. 2–4. In this case where the microstructure assembly 100 would then be representative of the mirror assembly 408 discussed above in relation to FIG. 5 and utilized by the mirror arrays 400, 442, and 462, the microstructure assembly 100 would be representative of two electrical loads (since there are two actuators 426 for each mirror assembly 408), each of the trace assemblies 84, and each of the three groupings represented by the microstructure electrical trace assemblies 92 would then be representative of two electrical traces.

Each pass-through electrical trace assembly 84 includes a pair of ends 88, 90 that are spaced in a direction in which the unit cell 72 is to be tiled (represented by the arrow A in FIG. 11) and that are disposed on the unit cell boundary 76. Similarly, each microstructure electrical trace assembly 92 includes an end 96 that is also disposed on the unit cell boundary 76. An opposite end of each microstructure electrical trace assembly 92 terminates within the unit cell 72 at one of the microstructure assemblies 100. Where the plurality of ends 88 of the various pass-through electrical trace assemblies 84 and the end 96 of any adjacently disposed microstructure electrical trace assembly 92 terminate collectively define one unit cell side 80a of the unit cell boundary 76 of the unit cell 72. Although the unit cell side 80a is linear in the illustrated embodiment, it may be of any appropriate shape. Where the plurality of ends 90 of the various pass-through electrical trace assemblies 84 and the end 96 of any adjacently disposed microstructure electrical trace assembly 92 terminate collectively define another unit cell side 80b of the unit cell boundary 76 of the unit cell 72 that is spaced from the unit cell side 80a in the direction of the tiling represented by arrow A. Although the unit cell side 80b is linear in the illustrated embodiment, it may be of any appropriate shape.

A number of boundary conditions exist for the unit cell 72 that allows a plurality of unit cells 72 (e.g., cells 72a, 72b, 72c, and 72d in FIG. 13) to be tiled by translation in the direction of the arrow A in FIG. 11. More specifically, these boundary conditions for the unit cell 72 at the unit cell sides 80a, 80b allow the unit cell 72 to be tiled in a manner that electrically interconnects the various trace assemblies 44, 52 of one unit cell 72 with the appropriate trace assembly 44, 52 of an adjacent unit cell 72 in the direction of the tiling. These boundary conditions are that: 1) the ends 88 and 90 of each pass-through electrical trace assembly 84 must be offset in a direction that is orthogonal (represented by reference line B in FIG. 11) to the direction in which the unit cell 72 is to be tiled (represented arrow A in FIG. 11); 2) the end 96 of each microstructure electrical trace assembly 92 on the unit cell side 80b must be disposed along a common reference line 112 (FIG. 12) with an end 88 of one of the pass-through electrical trace assemblies 84 on the unit cell side 80a, where this common reference line 112 is parallel to the direction in which the unit cell 72 is to be tiled (arrow A); 3) the end 96 of each microstructure electrical trace assembly 92 on the unit cell side 80a must be disposed along a common reference line 112 with an end 90 of one of the pass-through electrical trace assemblies 84 on the unit cell side 80b, where this common reference line 112 is parallel to the direction in which the unit cell 32 is to be tiled (arrow A); 4) each end 88 of each pass-through electrical trace assembly 84 on the unit cell side 80a must be disposed along a common reference line 112 with either an end 90 of a different pass-through electrical trace assemblies 84 on the unit cell side 80b or an end 96 of one of the microstructure electrical trace assemblies 92 on the unit cell side 80b, where this common reference line 112 is parallel to the direction in which the unit cell 72 is to be tiled (arrow A); and 5) each end 90 of each pass-through electrical trace assembly 84 on the unit cell side 80b must be disposed along a common reference line 112 with either an end 88 of a different pass-through electrical trace assemblies 84 on the unit cell side 80a or an end 96 of one of the microstructure electrical trace assemblies 92 on the unit cell side 80a, where this common reference line 112 is parallel to the direction in which the unit cell 72 is to be tiled (arrow A).

FIG. 13 illustrates four unit cells 72a–d that have been tiled together to define a tiled structure 116. The tiled structure 116 may be representative of a portion of one row of die 16 on the chip 26 of FIG. 1C. Generally, the side 80a of unit cell 72b is disposed in abutting relation to the side 80b of the unit cell 72a (the unit cell 72b having been tiled by translation from unit cell 72a in the direction of the arrow A), the side 80a of unit cell 72c is disposed in abutting relation to the side 80b of the unit cell 72b (the unit cell 72c having been tiled by translation from unit cell 72b in the direction of the arrow A), and the side 80a of unit cell 72d is disposed in abutting relation to the side 80b of the first unit cell 72c (the unit cell 72d having been tiled by translation from unit cell 72c in the direction of the arrow A). Based upon the above-noted configuration of the unit cell 72, each of the microstructure assemblies 100a–f in each of the unit cells 72a–d are accessible from either a perimeter or perimeter region 120a or a perimeter or perimeter region 120b of the tiled structure 116 in the same general manner discussed above in relation to the unit cell 32 of FIG. 6. Unlike the embodiment of FIG. 6, however, at least one pass-through electrical trace assembly 84 in unit cell 72a is interconnected with one pass-through electrical trace assembly 84 in unit cell 72b, which in turn is interconnected with one pass-through electrical trace assembly 84 in unit cell 72c, which in turn is interconnected with one pass-through electrical trace assembly 84 in unit cell 72c. Therefore, at least one additional unit cell 72 could still be added onto the tiled structure 116 and still have all of the microstructure assemblies 100a–f in each of the various unit cells 72 of the tiled structure 116 accessible from either the perimeter region 120a or the perimeter region 120b. This again is possible by having a different off-chip electrical contact associated with each single, individual electrical path within the unit cell 72. Again, at least some these off-chip electrical contacts may simply be passive electrodes. Moreover, the tiled structure 116 of FIG. 13 also illustrates that it may be necessary to create various electrical traces after the tiling for interconnecting with the various off-chip electrical contacts. In this regard, the tiled structure 116 includes a chip boundary trace assembly 104 that may have to be added onto each of the two ends of the tiled structure 166 for interconnection with appropriate off-chip electrical contacts (not shown).

In addition to allowing for establishment of a desired electrical interconnection between adjacently tiled unit cells 72 and for perimeter access of each of the microstructure assemblies 100 in the tiled structure 116, the configuration of the unit cell 72 also minimizes the width of the electrical bus (the collection of pass-through electrical trace assemblies 84 and device electrical trace assemblies 92 that progress through the tiled structure 116). The maximum required width of this electrical bus, or stated another way the maximum required number of electrical trace assemblies 88, 92 at any location in the tiled structure 116, is ½ the total number of microstructure assemblies 100 that are included in the tiled structure 116.

The unit cell 72 of FIG. 11 is actually defined by a pair of identical unit cell precursors 108a, 108b. The triangularly-shaped unit cell precursor 108a may be drawn. Since there are an odd number of terminations (e.g., an odd number of electrical load-based microstructures for the various microstructure assemblies 100) within the unit cell precursor 108a, there may be certain issues regarding the electrical trace bus if the unit cell precursor 108 is simply be translated in the manner discussed above in relation to the unit cell 72. In order to address these issues, a copy is made of the unit cell precursor 108a, which is the unit cell precursor 108b in FIG. 11. This unit cell precursor 108b is rotated from the position of the unit cell precursor 108a in FIG. 11, and is also translated in the direction of the arrow A in FIG. 11. This then defines the unit cell 72, which now has an even number of terminations within the unit cell 72 (e.g., an even number of electrical load-based microstructures for the various microstructure assemblies 100), such that it may then be copied and translated in the manner discussed above in relation to the unit cell 32 of FIG. 6.

Figure 14A:
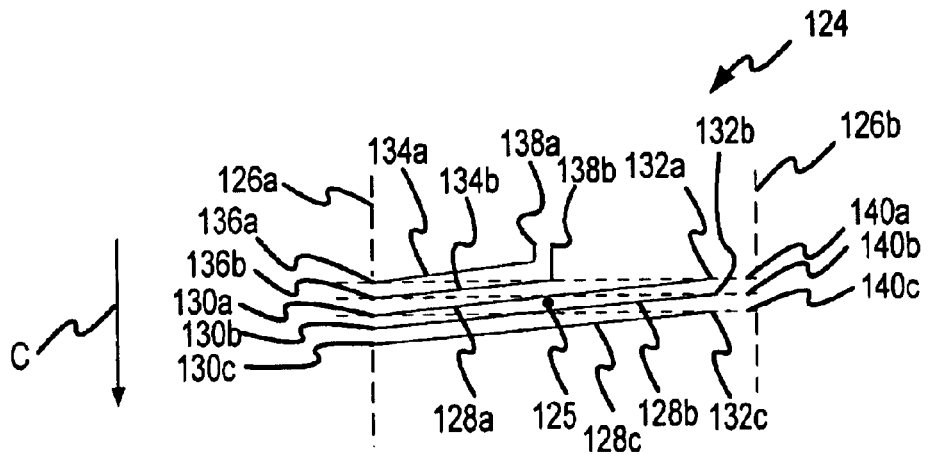
FIG. 14A is one embodiment of a unit cell precursor that may be used to define at least the type of electrical trace bus utilized by the mirror array of FIG. 3.

Another embodiment of a unit cell precursor 124 is illustrated in FIG. 14A. The unit cell precursor 124 may be viewed as a building block for creating a layout of the electrical trace bus 452 of the mirror array 442 of FIG. 3, or for defining the entirety of the mirror array 442. At least one pass-through electrical trace assembly 128 and at least one microstructure electrical trace assembly 134 define at least part of the unit cell precursor 124. Each pass-through electrical trace assembly 128 may be either a single electrical trace or may be representative of multiple electrical traces. Similarly, each microstructure electrical trace assembly 134 may be either a single electrical trace or may be representative of multiple electrical traces. An appropriate microstructure (not shown) may also be part of the unit cell precursor 124 and be electrically interconnected with the microstructure electrical trace assemblies 134. For instance, one mirror assembly 408 (FIG. 5) may be interconnected with both microstructure electrical trace assemblies 134 of the unit cell precursor 124 (e.g., to provide power to each of its actuators 426 via a single electrical path).

Each pass-through electrical trace assembly 128 is at least generally linearly extending and includes a pair of ends 130, 132. Each microstructure electrical trace assembly 134 includes a pair of ends 136, 138. Where the plurality of ends 130 of the various pass-through electrical trace assemblies 128 and the end 136 of any adjacently disposed microstructure electrical assembly trace 134 terminate collectively define one side 126a of the unit cell precursor 124. Although the side 126a is linear in the illustrated embodiment, it may be of any appropriate shape. Where the plurality of ends 132 of the various pass-through electrical trace assemblies 128 terminate collectively define another side 126b of the unit cell precursor 124. Although the side 126b is linear in the illustrated embodiment, it may be of any appropriate shape.

The ends 130 and 132 of each pass-through electrical trace assembly 128 are disposed on different reference lines 140a–c that are presented in FIG. 14A to illustrate certain features/characteristics of the unit cell precursor 124. Generally, the ends 130, 132 of each pass-through electrical trace assembly 128 may be characterized as being offset in a direction that is along or parallel to the sides 126a, 126b (perpendicular to the reference lines 140a–c in the illustrated embodiment).

Figure 14B:
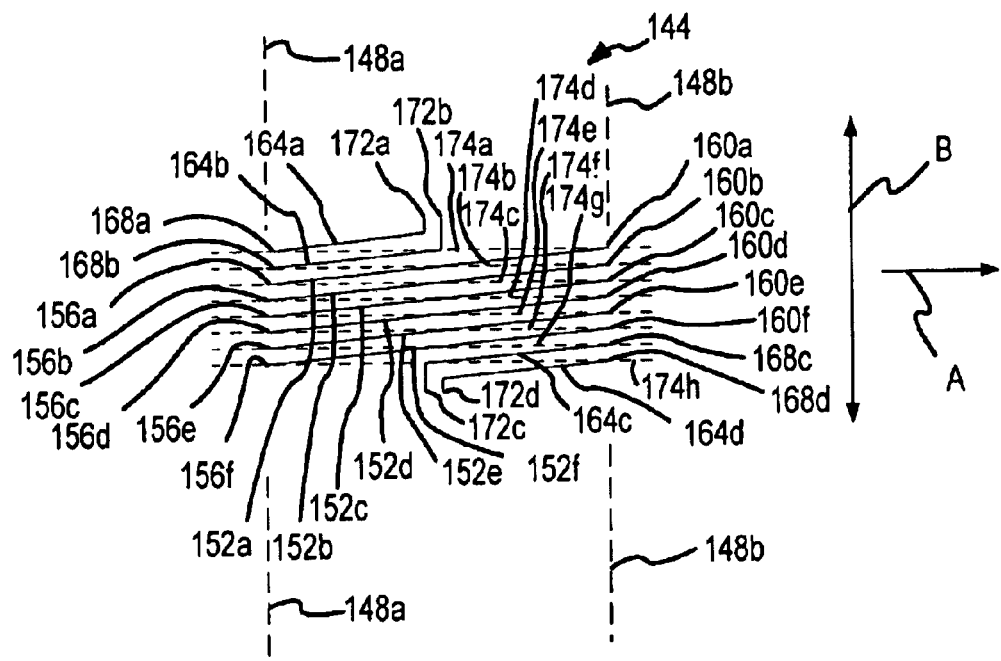
FIG. 14B is a unit cell that is defined by a pair of the unit cell precursors of FIG. 14A.

The unit cell precursor 124 of FIG. 14A is used to define the unit cell 144 of FIG. 14B. This may be done in any appropriate manner. One appropriate way is to rotate the unit cell precursor 124 one-hundred-eighty degrees about an axis 125, and to then translate this copy in the direction of the arrow C in FIG. 14A to define the unit cell 144 that is illustrated in FIG. 14B. The two unit cell precursors 124 are aligned such that each pass-through electrical trace assembly 128 of a first unit cell precursor 124 is aligned and interconnected with its own pass-through electrical trace assembly 128 of a second unit cell precursor 124. Generally, this unit cell 144 may then be tiled by translation in the direction of the arrow A in FIG. 14B to lay out the electrical trace bus 452 of the mirror array 442 of FIG. 3, or to lay out the entirety of the mirror array 442.

A plurality of pass-through electrical trace assemblies 152 and a plurality of microstructure electrical trace assemblies 164 define at least part of the unit cell 144. Each pass-through electrical trace assembly 152 may be either a single electrical trace or may be representative of multiple electrical traces. Similarly, each microstructure electrical trace assembly 164 may be either a single electrical trace or may be representative of multiple electrical traces. In the event that mirror assemblies 410 are included in the unit cell 144, the tiling of the same will lay out the electrical trace bus 452 and a pair of rows 444 of a plurality of mirror assemblies 410 of the configuration illustrated for the mirror array 442 in FIG. 3.

Each pass-through electrical trace assembly 152 includes a pair of ends 156, 160 that are spaced in a direction in which the unit cell 144 is to be tiled (represented by the arrow A in FIG. 14B). Similarly, each microstructure electrical trace assembly 164 includes a pair of ends 168, 172 that are spaced at least generally in a direction in which the unit cell 144 is to be tiled (again, represented by the arrow A in FIG. 14B). Where the plurality of ends 156 of the various pass-through electrical trace assemblies 152 and the ends 168a, 168b of the microstructure electrical trace assemblies 164a, 164b, respectively, terminate collectively define one unit cell side 148a of the unit cell 144. Although the unit cell side 148a is linear in the illustrated embodiment, it may be of any appropriate shape. Where the plurality of ends 160 of the various pass-through electrical trace assemblies 152 and the ends 168c, 168d of the microstructure electrical trace assemblies 164c, 164d, respectively, terminate collectively define another unit cell side 148b of the unit cell 144. Although the unit cell side 148b is linear in the illustrated embodiment, it may be of any appropriate shape.

A number of boundary conditions exist for the unit cell 144 that allows a plurality of unit cells 144 to be tiled by translation in the direction of the arrow A in FIG. 14B to define at least the electrical trace bus 452 of the mirror array 442 of FIG. 3. That is, these boundary conditions for the unit cell 144 at the unit cell sides 148a, 148b allow the unit cell 144 to be tiled in a manner that electrically interconnects the trace assemblies 152, 164 of one unit cell 144 with the appropriate trace assembly 152, 164 of an adjacent unit cell 144. These boundary conditions are that: 1) the ends 156 and 160 of each pass-through electrical trace assembly 152 must be offset in a direction that is orthogonal (represented by reference line B in FIG. 14B) to the direction in which the unit cell 144 is to be tiled (represented by arrow A in FIG. 14B) (stated another way, the ends 156 and 160 of each pass-through electrical trace assembly 152 are disposed on different reference lines 174a–h that are parallel to the direction of translation depicted by the arrow A in FIG. 14B); 2) the end 168 of each microstructure electrical trace assembly 164 on the unit cell side 148b must be disposed along a common reference line 174 with an end 156 of one of the pass-through electrical trace assemblies 152 on the unit cell side 148a; 3) the end 168 of each microstructure electrical trace assembly 164 on the unit cell side 148a must be disposed along a common reference line 174 with an end 160 of one of the pass-through electrical trace assemblies 152 on the unit cell side 148b; 4) each end 156 of each pass-through electrical trace assembly 152 on the unit cell side 148a must be disposed along a common reference line 174 with either an end 160 of a different pass-through electrical trace assembly 152 on the unit cell side 148b or an end 168 of one of the microstructure electrical trace assemblies 164 on the unit cell side 148b; and 5) each end 160 of each pass-through electrical trace assembly 152 on the unit cell side 148b must be disposed along a common reference line 174 with either an end 156 of a different pass-through electrical trace assembly 152 on the unit cell side 148a or an end 168 of one of the microstructure electrical trace assemblies 164 on the unit cell side 148a.

Another embodiment of a unit cell 176 is illustrated in FIGS. 15A–B. The unit cell 176 may be viewed as a building block for creating a layout for the electrical trace bus 406 of the mirror array 400 of FIG. 2, or for defining the entirety of the mirror array 400. A plurality of pass-through electrical trace assemblies 180 and a plurality of microstructure electrical trace assemblies 186 define at least part of the unit cell 176. Each pass-through electrical trace assembly 180 may be either a single electrical trace or may be representative of multiple electrical traces. Similarly, each microstructure electrical trace assembly 186 may be either a single electrical trace or may be representative of multiple electrical traces. In the event that mirror assemblies 410 are included in the unit cell 176, the tiling of the same will lay out the electrical trace bus 406 and one row 402 of a plurality of mirror assemblies 410 of the configuration illustrated for the mirror array 400 that is presented in FIG. 2.

Each pass-through electrical trace assembly 180 includes a pair of ends 182, 184 that are spaced in a direction in which the unit cell 176 is to be tiled (represented by the arrow A in FIG. 15A). Similarly, each microstructure electrical trace assembly 186 includes a pair of ends 188, 190 that are spaced in a direction in which the unit cell 176 is to be tiled (again, represented by the arrow A in FIG. 15A). Where the plurality of ends 182 of the various pass-through electrical trace assemblies 180 and the ends 188a, 188b of the microstructure electrical trace assemblies 186a, 186b, respectively, terminate collectively define one unit cell side 178a of the unit cell 176. Although the unit cell side 178a is linear in the illustrated embodiment, it may be of any appropriate shape. Where the plurality of ends 184 of the various pass-through electrical trace assemblies 180 and the ends 188c, 188d of the microstructure electrical trace assemblies 186c, 186d, respectively, terminate collectively define another unit cell side 178b of the unit cell 176. Although the unit cell side 178b is linear in the illustrated embodiment, it may be of any appropriate shape. It should be noted that the microstructure electrical trace assemblies 186c, 186d cross over the pass-through electrical trace assemblies 180a–f for termination at their ends 190c, 190d. This may be done by using the various structural levels in a surface micromachined system.

A number of boundary conditions exist for the unit cell 176 that allows a plurality of unit cells 176 (e.g., cells 176a, 176*b*, and 176*c* in FIG. 15C) to be tiled by translation in the direction of the arrow A in FIG. 15A to define at least the electrical trace bus 406 of the mirror array 400 of FIG. 2. That is, these boundary conditions for the unit cell 176 at the unit cell sides 178*a*, 178*b* allow the unit cell 176 to be tiled in a manner that electrically interconnects the trace assemblies 180, 186 of one unit cell 176 with the appropriate trace assembly 180, 186 of an adjacent unit cell 176. These boundary conditions are that: 1) the ends 182 and 184 of each pass-through electrical trace assembly 180 must be offset in a direction that is orthogonal (represented by reference line B in FIG. 15A) to the direction in which the unit cell 176 is to be tiled (represented by arrow A in FIG. 15A) (stated another way, the ends 182 and 184 of each pass-through electrical trace assembly 180 are disposed on different reference lines 192*a–h* that are parallel to the direction of translation depicted by the arrow A in FIG. 15A); 2) the end 188 of each microstructure electrical trace assembly 186 on the unit cell side 178*b* must be disposed along a common reference line 192 with an end 182 of one of the pass-through electrical trace assemblies 180 on the unit cell side 178*a*; 3) the end 188 of each microstructure electrical trace assembly 186 on the unit cell side 178*a* must be disposed along a common reference line 192 with an end 184 of one of the pass-through electrical trace assemblies 180 on the unit cell side 178*b*; 4) each end 182 of each pass-through electrical trace assembly 180 on the unit cell side 178*a* must be disposed along a common reference line 192 with either an end 184 of a different pass-through electrical trace assembly 180 on the unit cell side 178*b* or an end 188 of one of the microstructure electrical trace assemblies 186 on the unit cell side 178*b*; and 5) each end 184 of each pass-through electrical trace assembly 180 on the unit cell side 178*b* must be disposed along a common reference line 192 with either an end 182 of a different pass-through electrical trace assembly 180 on the unit cell side 178*a* or an end 188 of one of the microstructure electrical trace assemblies 186 on the unit cell side 178*a*.

Another feature of the unit cell 176 of FIGS. 15A–C is that there are different numbers of electrical traces at different areas of the cell 176. For instance, at location C in FIG. 15C, there are 8 total trace assemblies 180, 186. Conversely, at location D in FIG. 15C, there are 6 total electrical trace assemblies 180, 186. Therefore, the electrical trace bus 406 may be defined by a unit cell 176 that provides for alternating segments of different numbers of total electrical trace assemblies 180, 186.

Figure 16:
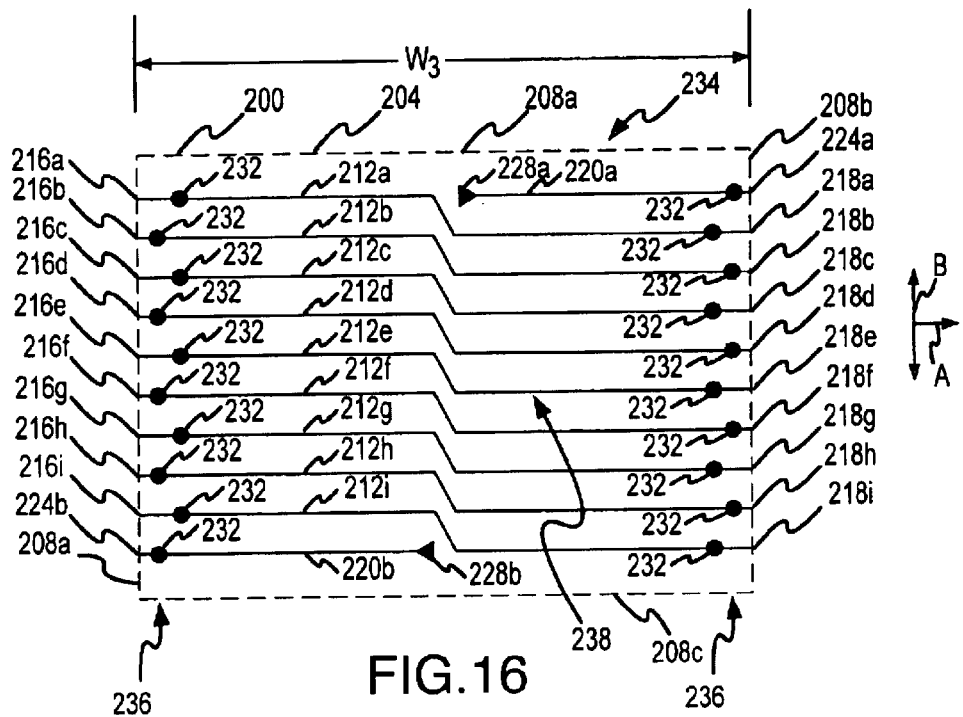
FIG. 16 is an embodiment of a unit cell that is in the form of an entire die.

Another embodiment of a unit cell 200 that defines an entire die 234 (i.e., a single exposure field of a stepper) is illustrated in FIG. 16. The unit cell 200/die 234 includes a die perimeter region 236 that includes a plurality of off-chip electrical contacts 232, and a device region 238 disposed inwardly thereof. The unit cell 200 is an enclosed space that is defined by a unit cell boundary 204.

A plurality of pass-through electrical trace assemblies 212, a plurality of microstructure electrical trace assemblies 220, and a plurality of microstructure assemblies 228 define at least part of the unit cell 200. In one embodiment, the microstructures assemblies 228 are the above-noted mirror assemblies 408 in the form of an appropriate mirror array (e.g., the mirror array 400 of FIG. 2; the mirror array 442 of FIG. 3; the mirror array 462 of FIG. 4). Each pass-through electrical trace assembly 212 may be either a single electrical trace or may be representative of multiple electrical traces. Similarly, each microstructure electrical trace assembly 220 may be either a single electrical trace or may be representative of multiple electrical traces. Although each off-chip electrical contact 232 is illustrated as being "in-line" with the relevant electrical trace assembly 212, 220, in accordance with the foregoing all that is required is that each off-chip electrical contact 232 be appropriately electrically interconnected with a single electrical path within the unit cell 200.

Each pass-through electrical trace assembly 212 includes a pair of ends 216, 218 that are spaced in a direction in which the unit cell 200 is to be tiled and that are disposed on the unit cell boundary 204 (the direction of the tiling being represented by the arrow A in FIG. 16). Similarly, each microstructure electrical trace assembly 220 includes an end 224 that is also disposed on the unit cell boundary 204. An opposite end of each microstructure electrical trace assembly 220 terminates in the device region 238 at one of the microstructure assemblies 228. Where the plurality of ends 216 of the various pass-through electrical trace assemblies 212 and the ends 224 of any adjacently disposed microstructure electrical trace assemblies 220 terminate collectively define one unit cell side 208*a* of the unit cell 200. Where the plurality of ends 218 of the various pass-through electrical trace assemblies 212 and the ends 224 of any adjacently disposed microstructure electrical trace assemblies 220 terminate collectively define another unit cell side 208*b* of the unit cell 200.

A number of boundary conditions exist for the unit cell 200 that allows a plurality of unit cells 200 (e.g., cells 200*a*, 200*b*, and 200*c* in FIG. 17; cells 200*d*, 200*e*, and 200*f* in FIG. 17) to be tiled by translation in the direction of the arrow A in FIG. 16. More specifically, these boundary conditions for the unit cell 200 at the unit cell sides 208*a*, 208*b* allow the unit cell 200 to be tiled in a manner that electrically interconnects the trace assemblies 212, 220 of one unit cell 200 with the appropriate trace assembly 212, 220 of an adjacent unit cell 200 in the direction of the tiling. These boundary conditions are that: 1) the ends 216 and 218 of each pass-through electrical trace assembly 212 must be offset in a direction that is orthogonal (represented by reference line B in FIG. 16) to the direction in which the unit cell 200 is to be tiled (represented by arrow A in FIG. 16); 2) the end 224 of each microstructure electrical trace assembly 220 on the unit cell side 208*b* must be disposed along a common reference line that is collinear with or parallel to the direction of translation, with an end 216 of one of the pass-through electrical trace assemblies 212 on the unit cell side 208*a*; 3) the end 224 of each microstructure electrical trace assembly 220 on the unit cell side 208*a* must be disposed along a common reference line that is collinear with or parallel to the direction of translation, with an end 218 of one of the pass-through electrical trace assemblies 212 on the unit cell side 208*b*; 4) each end 216 of each pass-through electrical trace assembly 212 on the unit cell side 208*a* must be disposed along a common reference line that is collinear with or parallel to the direction of translation, with either an end 218 of a different pass-through electrical trace assembly 212 on the unit cell side 208*b* or an end 224 of one of the microstructure electrical trace assemblies 220 on the unit cell side 208*b*; and 5) each end 218 of each pass-through electrical trace assembly 212 on the unit cell side 208*b* must be disposed along a common reference line that is collinear with or parallel to the direction of translation, with either an end 216 of a different pass-through electrical trace assembly 212 on the unit cell side 208*a* or an end 224 of one of the microstructure electrical trace assemblies 220 on the unit cell side 208*a*.

Figure 17:
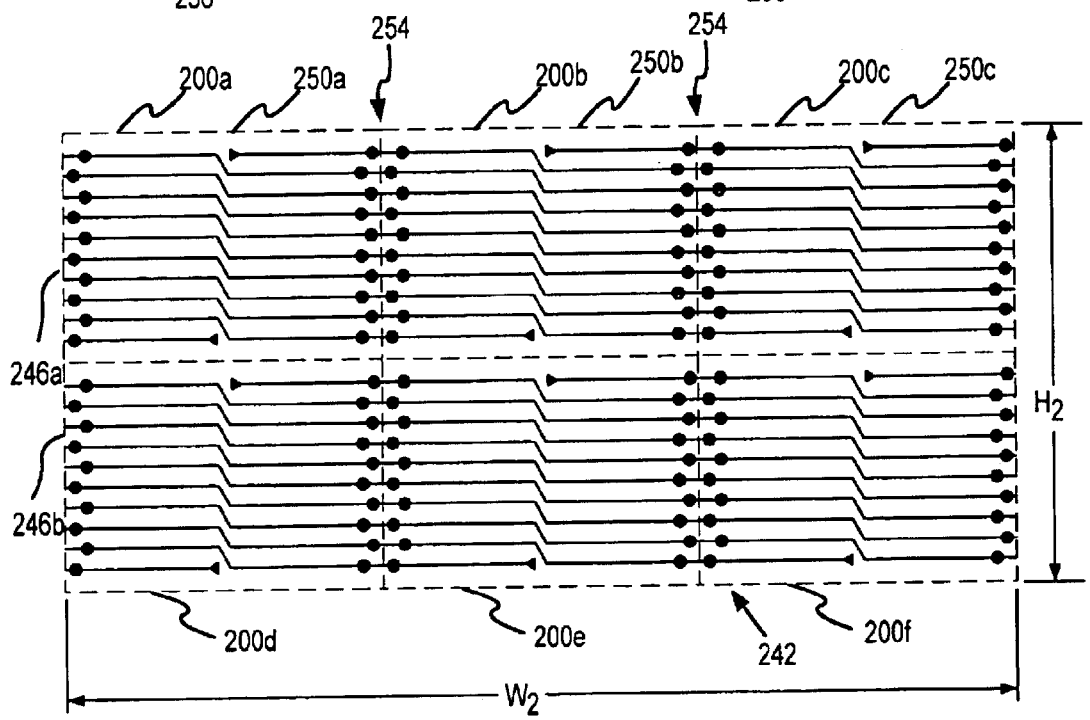
FIG. 17 is one embodiment of a chip that may be defined by tiling a plurality of the unit cells of FIG. 16.

One embodiment of a chip 242 is illustrated in FIG. 17 that may be formed by tiling the unit cell 200 of FIG. 16.

Generally, the unit cell 200 of FIG. 16 is tiled to define a row 246a of unit cells 200a, 200b, and 200c that are electrically interconnected based upon the unit cell 200 satisfying the above-noted boundary conditions. Similarly, the unit cell 200 of FIG. 16 is tiled to define a row 246b of unit cells 200d, 200e, and 200f that are electrically interconnected based upon the unit cell 200 satisfying the above-noted boundary conditions. Generally, the unit cell side 208b of the unit cell 200a is disposed against the unit cell side 208a of the unit cell 200b, while the unit cell side 208b of the unit cell 200b is disposed against the unit cell side 208a of the unit cell 200c. Similarly, the unit cell side 208b of the unit cell 200d is disposed against the unit cell side 208a of the unit cell 200e, while the unit cell side 208b of the unit cell 200e is disposed against the unit cell side 208a of the unit cell 200f. Although the unit cells 200 in each row 246 of the chip 242 are electrically interconnected, adjacently disposed unit cells 200 in any column 250 of the chip 215 are not electrically interconnected. Any number of rows 246 of tiled unit cells 200 may be utilized by the chip 242. Since the unit cell 200 defines an entire die 234, since there are a plurality of off-chip electrical contacts 232 disposed in a die perimeter region 236 between the unit cell side 208a and the device region 238 and between the unit cell side 208b and the device region 238, disposing the unit cell sides 208a or 208b of one unit cell 200 alongside the unit cell side 208a or 208b of another unit cell 200 results in there being a plurality of off-chip electrical contacts 232 in what may be characterized as an inter-die region 254 between each pair of adjacent unit cells 200 in any row 246 of the chip 242. Adjacently disposed die perimeter regions 238 may be characterized as an inter-die region 254. The off-chip electrical contacts 232 in each inter-die region 254 function solely as passive electrodes.

One advantage of the unit cell 200 of FIG. 16 is that a layout of a plurality of unit cells 200 on a wafer 12 may be done that is similar to that illustrated in FIG. 1A (i.e., each of the die 16 in FIG. 1A would then be a unit cell 200). The layout of the various unit cells 200 does not have to be dictated by the size of a chip 242 to be diced from the wafer 12. In one embodiment, a chip 242 may be diced from the wafer 12 having an integer number of rows of unit cells 200 and an integer number of columns 250 of unit cells 200. Chips 242 having different number of unit cells 200 may be diced from the same wafer 12. In fact, a particular chip 242 need not include an integer number of rows 246 of complete unit cells 200. Consider the mirror array 400 of FIG. 2 and the mirror array 442 of FIG. 3. In the case where a mirror array 400 is included in the unit cell 200, any integer number of rows 402 of mirror assemblies 408 may be included in a particular chip 242 (i.e., less than the number of rows 402 in a given unit cell 200 may be included in the chip 242 by dicing between the electrical trace bus 406 and a row 402 of mirror assemblies 410 that are not electrically interconnected with the particular bus 406). In one embodiment of a chip 242, the multiple rows 402 of mirror assemblies 408 collectively span less than one die in a direction that is orthogonal to the direction in which the rows 402 extend. That is, a chip height $H_2$ for such a chip 242 would less than a height of a single die or less than a height of a single unit cell 200 in this case. In another embodiment of a chip 242, the multiple rows 402 of mirror assemblies 408 collectively span at least one die in a direction that is orthogonal to the direction in which the rows 402 extend. That is, a chip height $H_2$ for such a chip 242 would be greater than or equal to a height of a single die or greater than or equal to a height of a single unit cell 200 in this case. As such, a chip 242 may be separated from the wafer 12 so as to include at least one full row 242 of unit cells 200, and may also contain at least one partial row of unit cells 200.

In the case where the mirror array 442 is included in a unit cell 200, any even integer number of rows 444 of mirror assemblies 408 may be included in a particular chip 242 (i.e., less than the number of rows 444 in a mirror array defined by a given unit cell 200 may be included in the chip 242 by dicing between an electrical trace bus 406 and a row 402 of mirror assemblies 410 that is not electrically interconnected with the particular bus 406). An even integer number of rows 444 should be included in the chip 242 since each electrical trace bus 452 services two rows 444 of mirror assemblies 408.

Although partial die or unit cells 200 may define a chip height $H_2$ for a particular chip 242 (FIG. 17), the chip width $W_2$ for any chip 242 defined by a tiling of the unit cell 200 should be an integer multiple of the width $W_3$ of the unit cell 200 (FIG. 16). In fact, a full width $W_3$ should be utilized for each unit cell 200 that is tiled to define a chip 242.

It should be appreciated that in the embodiments of FIGS. 3–4, 6–14, and 16–17, none of the electrical traces cross each other in the routing of the various electrical trace bus configurations disclosed therein. This is desirable in that it reduces the number of levels in a surface micromachined system that are required for routing electrical signals throughout the system.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain best modes known of practicing the invention and to enable others skilled in the art to utilize the invention in such, or other embodiments and with various modifications required by the particular application(s) or use(s) of the present invention. It is intended that the appended claims be construed to include alternative embodiments to the extent permitted by the prior art.

What is claimed is:

1. A chip, comprising:
   a row of a plurality of unit cells, wherein said row extends in a first direction, wherein each said unit cell in said row is of the same configuration and comprises:
   first and second sides that are spaced along said first direction, wherein said first and second sides define a pair of opposite sides of said unit cell;
   a plurality of first electrical traces that extend between said first and second sides; and
   a plurality of second electrical traces that extend from any of said first and second sides and terminate at an interior locale prior to reaching the other of said first and second sides, wherein each said first electrical trace at said first side and one of either another said first electrical trace at said second side or one said second electrical trace at said second side are disposed along a common reference line that is parallel with said first direction, wherein each said second electrical trace at said first side and one of said first electrical traces at said second side are disposed along a common reference line that is parallel with said first direction, wherein each said second electrical trace at said second side and one of said first electrical traces at said first side are disposed along a common reference line that is parallel with said first direction, and wherein:
said plurality of unit cells comprises first and second units cells that are disposed on first and second ends of said row, wherein said first side of said first unit cell is on a first perimeter region of said chip, and wherein said second side of said second unit cell is on a second perimeter region of said chip;
each adjacent pair of said unit cells in said row are disposed in abutting relation such that said first side of one said unit cell abuts said second side of another said unit cell and are electrically interconnected;
each said first electrical trace of each said unit cell is electrically interconnected with either one said first electrical trace or one said second electrical trace of an adjacent said unit cell, and wherein each said second electrical trace of each said unit cell that does not terminate at either of said first side of said first unit cell or said second side of said second unit cell is electrically interconnected with a first electrical trace of an adjacent said unit cell; and
each said second electrical trace is accessible from either said first side of said first unit cell or said second side of said second unit cell.

2. A chip, as claimed in claim 1, further comprising:
a plurality of said rows.

3. A chip, as claimed in claim 1, wherein:
a spacing between said first and second sides of each said unit cell corresponds with a single exposure field of a photolithographic stepper in one dimension.

4. A chip, as claimed in claim 1, wherein:
each said unit cell comprises at least a portion of a separate die.

5. A chip, as claimed in claim 1, wherein:
each said unit cell comprises an entire separate die.

6. A chip, as claimed in claim 1, wherein:
each said unit cell further comprises a plurality of microstructure assemblies.

7. A chip, as claimed in claim 6, wherein:
each said microstructure assembly comprises at least one electrical load-based microstructure, wherein each said electrical load-based microstructure is interconnected with a different said second electrical trace.

8. A chip, as claimed in claim 6, wherein: said chip comprises at least one device region disposed between said first and second perimeter regions, a first off-chip contact region in said first perimeter region, and a second off-chip contact region in said second perimeter region, wherein each said microstructure assembly comprises at least one electrical load-based microstructure, wherein each said microstructure assembly is disposed in a said device region, and wherein each said electrical load-based microstructure is electrically addressable from one of said first and second off-chip contact regions.

9. A chip, as claimed in claim 8, wherein:
said first and second off-chip contact regions each comprise a plurality of off-chip electrical contacts, wherein each said off-chip electrical contact is electrically interconnected with a different single electrical path to a different said electrical load-based microstructure.

10. A chip, as claimed in claim 8, wherein:
each said microstructure assembly comprises a mirror assembly and at least one actuator, wherein each said actuator comprises one of said electrical load-based microstructures.

11. A chip, as claimed in claim 6, wherein:
a number of said plurality of unit cells is such there is at least one pass-through electrical trace, wherein each said pass-through electrical trace comprises one said first electrical trace from each of said unit cells that are electrically interconnected, wherein each said pass-through electrical trace is electrically disconnected from each said electrical load-based microstructure in said row.

12. A chip, as claimed in claim 1, further comprising:
first and second rows of a plurality of microstructure assemblies; and
an electrical trace bus located between said first and second rows, wherein said electrical trace bus comprises said plurality of first and second electrical traces from said plurality of unit cells.

13. A chip, as claimed in claim 12, wherein:
said electrical trace bus is interconnected with at least some of said plurality of microstructure assemblies in only one of said first and second rows.

14. A chip, as claimed in claim 12, wherein:
said electrical trace bus is interconnected with at least some of said plurality of microstructure assemblies in each of said first and second rows.

15. A chip, as claimed in claim 12, wherein:
each of said plurality of microstructure assemblies comprises a mirror assembly, wherein each said mirror assembly comprises a mirror and means for moving said mirror.

16. A chip, as claimed in claim 12, wherein:
said chip comprises a width dimension, wherein said first and second rows extend in said width dimension, wherein said height dimension is perpendicular to said width dimension, wherein said mirrors in each of said first and second rows are equally spaced by a first distance, and wherein said width dimension of said chip is an integer multiple of said first distance.

17. A chip, as claimed in claim 1, wherein:
each said second electrical trace in each said unit cell is interconnected with one microstructure within the same said unit cell.

18. A chip, as claimed in claim 1, wherein:
each said first electrical trace in each said unit cell is offset at said first and second sides of its corresponding said unit cell in a direction that is orthogonal to said first direction.

19. A chip, as claimed in claim 1, wherein:
each said second electrical trace in each said unit cell is offset between its corresponding said interior locale and at its corresponding said first or side second side of its corresponding said unit cell in a direction that is orthogonal to said first direction.

20. A chip, as claimed in claim 1, wherein:
for each said unit cell in said row, at least one said second electrical trace extends from said first side of its corresponding said unit cell and at least one said second electrical trace extends from said second side of its corresponding said unit cell.

21. A chip, as claimed in claim 1, wherein:
each said unit cell comprises a device region disposed between its corresponding said first and second sides, a plurality of first off-chip electrical contacts disposed between it corresponding said device region and its corresponding said first side, and a plurality of second off-chip electrical contacts disposed between its corresponding said device region and its corresponding said second side.

22. A chip, as claimed in claim 21, wherein:

each of said first and second off-chip electrical contacts is associated with a different, single electrical path, wherein said electrical path is selected from the group consisting of one said second electrical trace, or at least one said first electrical trace and one said second electrical trace.

23. A chip, as claimed in claim 1, further comprising:

a plurality of electrical load-based microstructures; and an electrical trace bus electrically interconnected with at least some of said plurality of electrical load-based microstructures and that progresses through at least a portion of each of said plurality of unit cells, wherein said electrical trace bus comprises said plurality of first and second electrical traces, and wherein a maximum number of said first and second electrical traces in any portion of said electrical trace bus is one-half of a number of said electrical load-based microstructures that are electrically interconnected with said electrical trace bus.

24. A chip, as claimed in claim 1, wherein:

said plurality of unit cells collectively define an electrical bus, wherein each said unit cell comprises first and second electrical bus sections that are disposed in end-to-end relation, wherein each of said first and second electrical bus sections in each said unit cell comprises at least some of said plurality of first and second electrical traces, wherein a number of said first and second electrical traces in said first electrical bus section is different from a number of said first and second electrical traces in said second electrical bus section for each said unit cell.

25. A chip, as claimed in claim 1, wherein:

each said unit cell comprises an even number of said second electrical traces.

26. A chip, as claimed in claim 1, wherein:

each said unit cell comprises an even number of said first electrical traces.

27. A chip, as claimed in claim 1, further comprising:

at least one second row, wherein each said second row comprises a plurality of partial said unit cells.

28. A chip, as claimed in claim 1, further comprising:

a plurality of said rows, wherein a first group of said plurality of rows is from a first die and a second group of said plurality of rows is from a second die.

29. A chip, as claimed in claim 28, wherein:

said first group encompasses at least part of said first die and said second group encompasses at least part of said second die.

30. A chip as claimed in claim 1, wherein:

none of the said plurality of first and second electrical traces cross over each other.

* * * * *